(12) United States Patent
Ebihara et al.

(10) Patent No.: US 10,020,367 B2
(45) Date of Patent: Jul. 10, 2018

(54) SILICON CARBIDE SEMICONDUCTOR DEVICE

(71) Applicant: Mitsubishi Electric Corporation, Chiyoda-ku (JP)

(72) Inventors: Kohei Ebihara, Tokyo (JP); Akihiro Koyama, Tokyo (JP); Hidenori Koketsu, Tokyo (JP); Akemi Nagae, Tokyo (JP); Kotaro Kawahara, Tokyo (JP); Hiroshi Watanabe, Tokyo (JP); Kensuke Taguchi, Tokyo (JP); Shiro Hino, Tokyo (JP)

(73) Assignee: Mitsubishi Electric Corporation, Chiyoda-ku (JP)

( * ) Notice: Subject to any disclaimer, the term of this patent is extended or adjusted under 35 U.S.C. 154(b) by 0 days.

(21) Appl. No.: 15/307,303

(22) PCT Filed: Dec. 15, 2014

(86) PCT No.: PCT/JP2014/083094
§ 371 (c)(1),
(2) Date: Oct. 27, 2016

(87) PCT Pub. No.: WO2015/166608
PCT Pub. Date: Nov. 5, 2015

(65) Prior Publication Data
US 2017/0221998 A1 Aug. 3, 2017

(30) Foreign Application Priority Data
Apr. 30, 2014 (JP) .................................. 2014-093252

(51) Int. Cl.
*H01L 29/16* (2006.01)
*H01L 29/872* (2006.01)
(Continued)

(52) U.S. Cl.
CPC .......... *H01L 29/1608* (2013.01); *H01L 29/06* (2013.01); *H01L 29/0619* (2013.01);
(Continued)

(58) Field of Classification Search
CPC ............. H01L 29/0619; H01L 29/6606; H01L 29/66143; H01L 29/7811; H01L 29/7806; H01L 29/872
See application file for complete search history.

(56) References Cited

U.S. PATENT DOCUMENTS 7,026,650 B2 4/2006 Ryu et al.
7,394,158 B2 7/2008 Carta et al.
(Continued)

FOREIGN PATENT DOCUMENTS

JP 61-288426 A 12/1986
JP 62-67871 A 3/1987
(Continued)

OTHER PUBLICATIONS

Japanese Office Action dated Mar. 1, 2016 in Japanese Application No. 2016-500009 (with English Translation).
(Continued)

*Primary Examiner* — Bryan Junge
(74) *Attorney, Agent, or Firm* — Oblon, McClelland, Maier & Neustadt, L.L.P.

(57) ABSTRACT

An object of the present invention is to provide a silicon carbide semiconductor device with which the electric field at the time of switching is relaxed and the element withstand voltage can be enhanced. The distance between the outer peripheral end of a second surface electrode and the inner peripheral end of a field insulation film is smaller than the distance between an outer peripheral end of the second surface electrode and an inner peripheral end of the field insulation film in the case where the electric field strength
(Continued)

applied to the outer peripheral lower end of the second surface electrode is calculated so as to become equal to the smallest dielectric breakdown strength among the dielectric breakdown strength of the field insulation film and the dielectric breakdown strength of the surface protective film at the time of switching when the value of dV/dt is greater than or equal to 10 kV/μs.

17 Claims, 17 Drawing Sheets

(51) Int. Cl.
  *H01L 29/36*    (2006.01)
  *H01L 29/06*    (2006.01)
  *H01L 29/66*    (2006.01)
  *H01L 29/78*    (2006.01)

(52) U.S. Cl.
  CPC .......... *H01L 29/36* (2013.01); *H01L 29/6606* (2013.01); *H01L 29/78* (2013.01); *H01L 29/7823* (2013.01); *H01L 29/872* (2013.01)

(56) References Cited

U.S. PATENT DOCUMENTS

| | | | |
|---|---|---|---|
| 7,419,877 B2 | 9/2008 | Ryu et al. | |
| 7,842,549 B2 | 11/2010 | Ryu et al. | |
| 8,124,480 B2 | 2/2012 | Ryu et al. | |
| 8,624,347 B2 | 1/2014 | Nagai et al. | |
| 9,159,846 B2 | 10/2015 | Mitani et al. | |
| 9,240,451 B2 | 1/2016 | Imai | |
| 9,263,543 B2 | 2/2016 | Imai | |
| 2003/0067033 A1* | 4/2003 | Kinoshita | H01L 29/0619 257/328 |
| 2008/0237608 A1* | 10/2008 | Richieri | H01L 29/1608 257/77 |
| 2010/0032848 A1* | 2/2010 | Philippsen | H01L 23/525 257/779 |
| 2012/0146055 A1* | 6/2012 | Mitani | H01L 29/0619 257/77 |
| 2014/0117487 A1 | 5/2014 | Nagai et al. | |
| 2015/0001554 A1* | 1/2015 | Imai | H01L 29/47 257/77 |
| 2015/0060882 A1* | 3/2015 | Tarui | H01L 29/36 257/77 |
| 2015/0295096 A1* | 10/2015 | Oka | H01L 29/872 257/76 |

FOREIGN PATENT DOCUMENTS

| | | |
|---|---|---|
| JP | 2006-516815 A | 7/2006 |
| JP | 2008-34646 A | 2/2008 |
| JP | 2008-518445 A | 5/2008 |
| JP | 2009-94433 A | 4/2009 |
| JP | 2012-23199 A | 2/2012 |
| JP | 2012-124329 A | 6/2012 |
| JP | 2013-211503 A | 10/2013 |
| JP | 2014-41920 A | 3/2014 |
| WO | 2004/066392 A1 | 8/2004 |
| WO | 2006/047382 A2 | 5/2006 |
| WO | 2013-222907 A | 10/2013 |

OTHER PUBLICATIONS

Japanese Office Action dated May 31, 2016 in Japanese Application No. 2016-500009 (with English Translation).

Japanese Office Action dated Oct. 4, 2016 in Japanese Application No. 2016-500009 (with English Translation).

International Search Report dated Mar. 3, 2015 in PCT/JP14/083094 Filed Dec. 15, 2014.

International Preliminary Report on Patentability and Written Opinion dated Nov. 1, 2016 in PCT/JP2014/083094 (with English translation).

* cited by examiner

F I G . 1
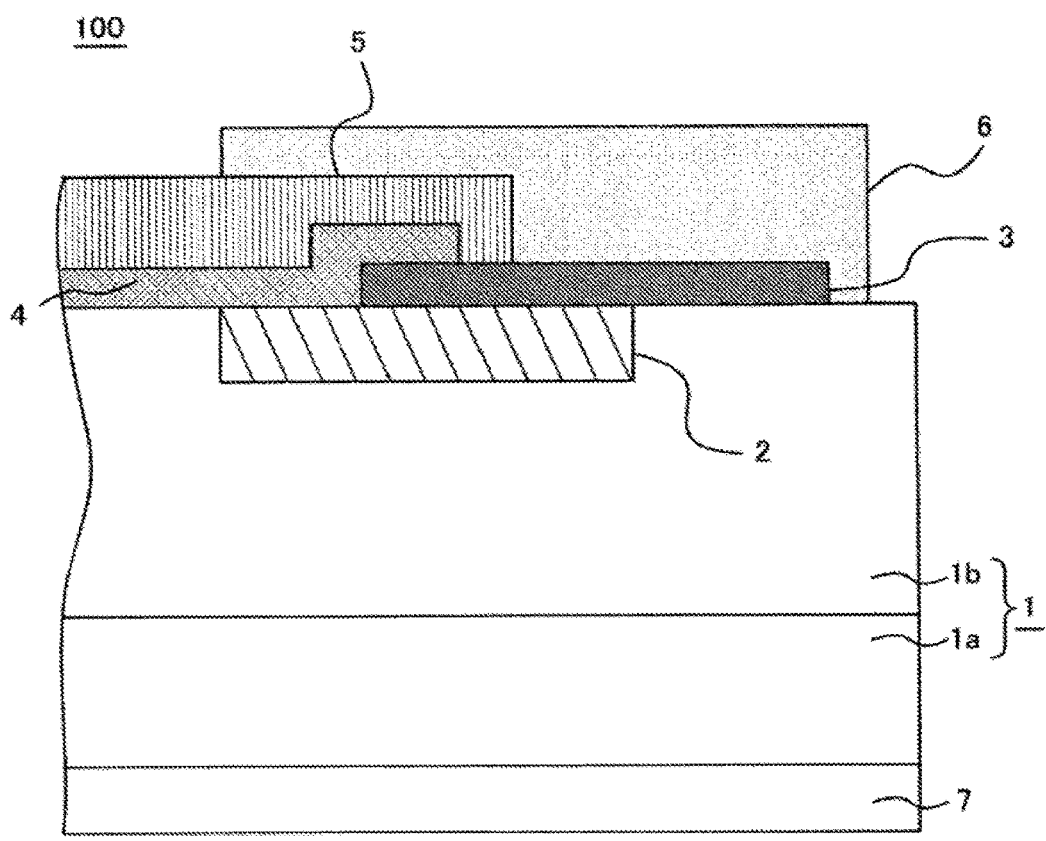

F I G. 2
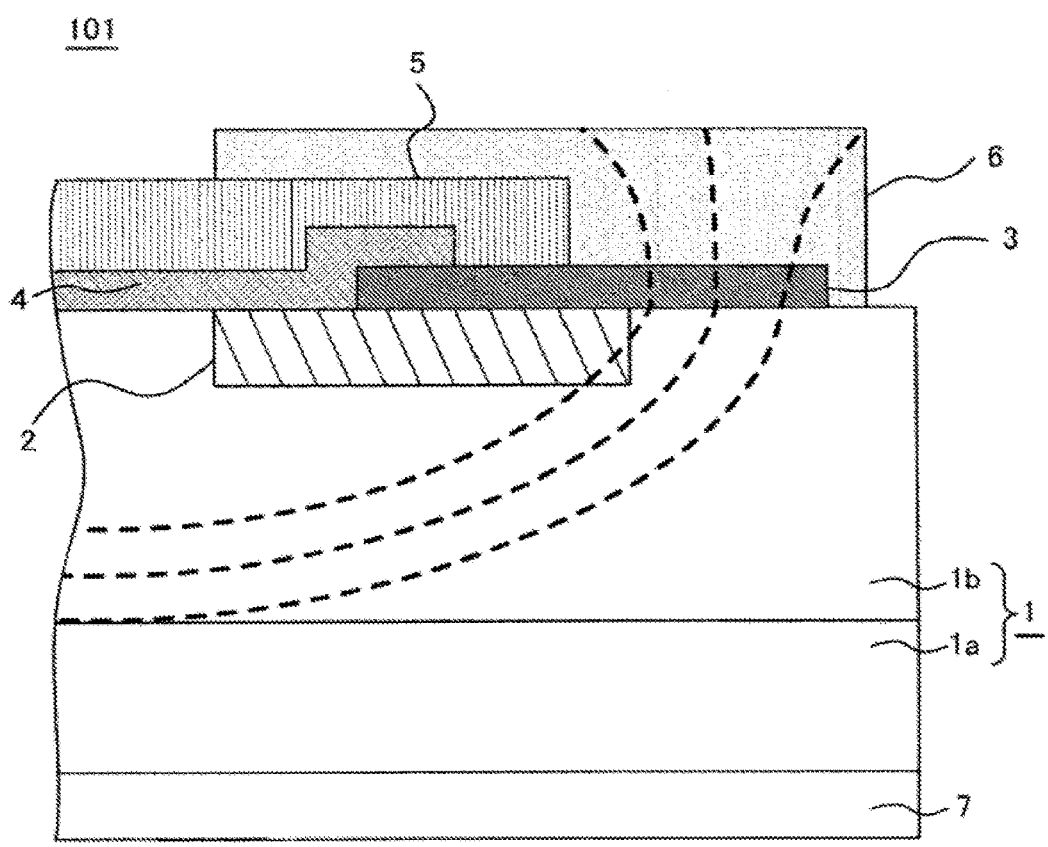

F I G . 3
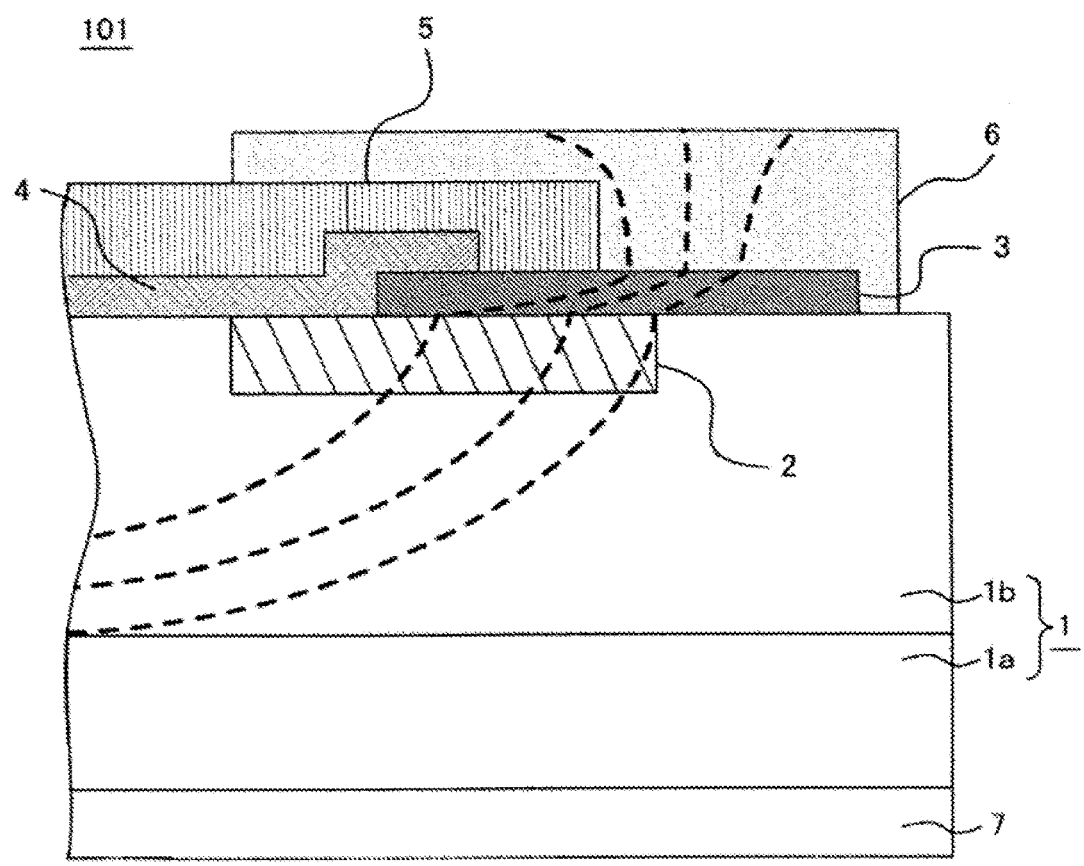

F I G . 4
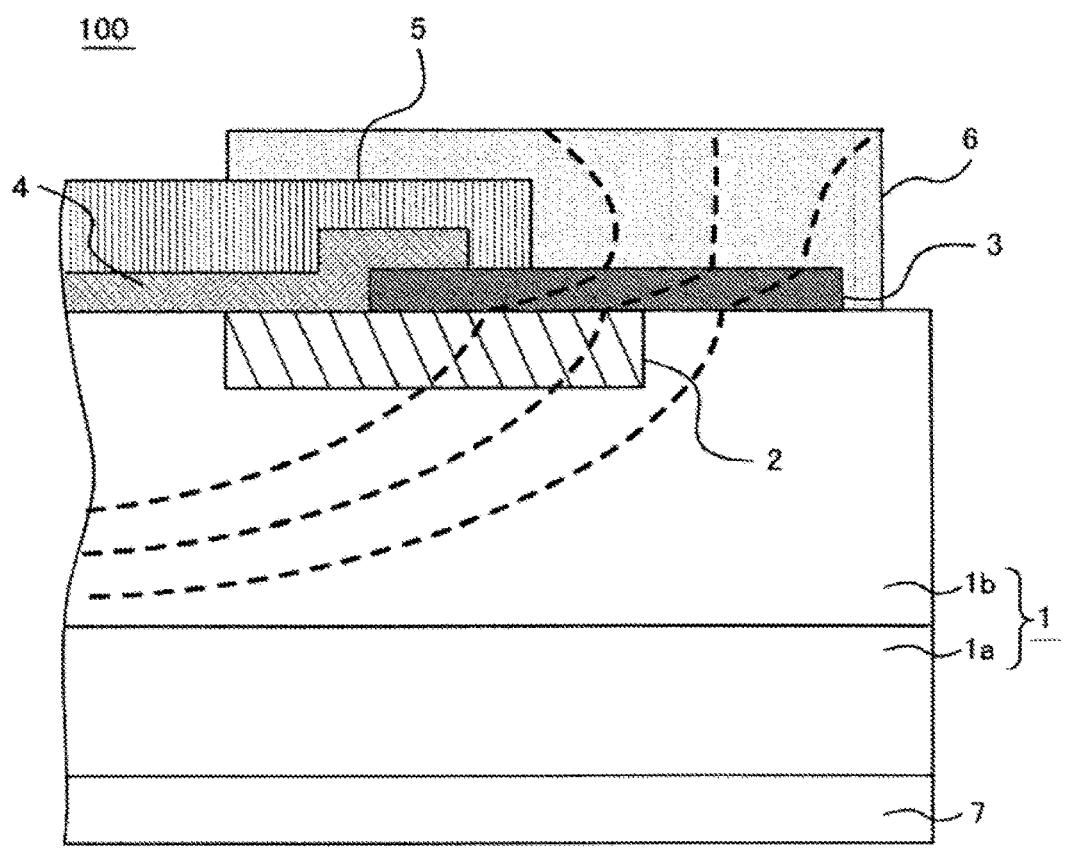

F I G . 5
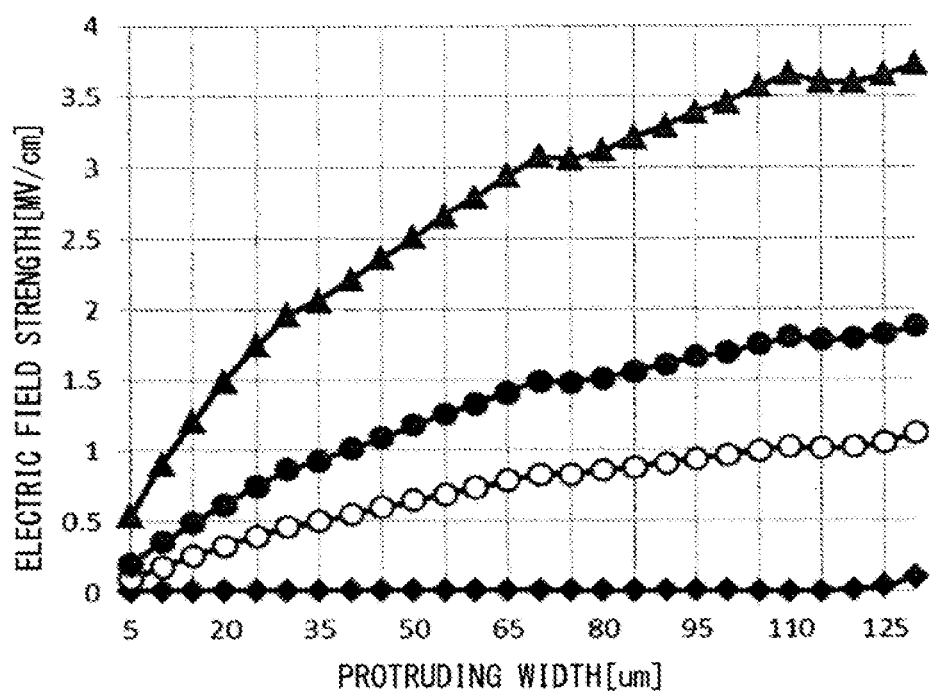

F I G . 6
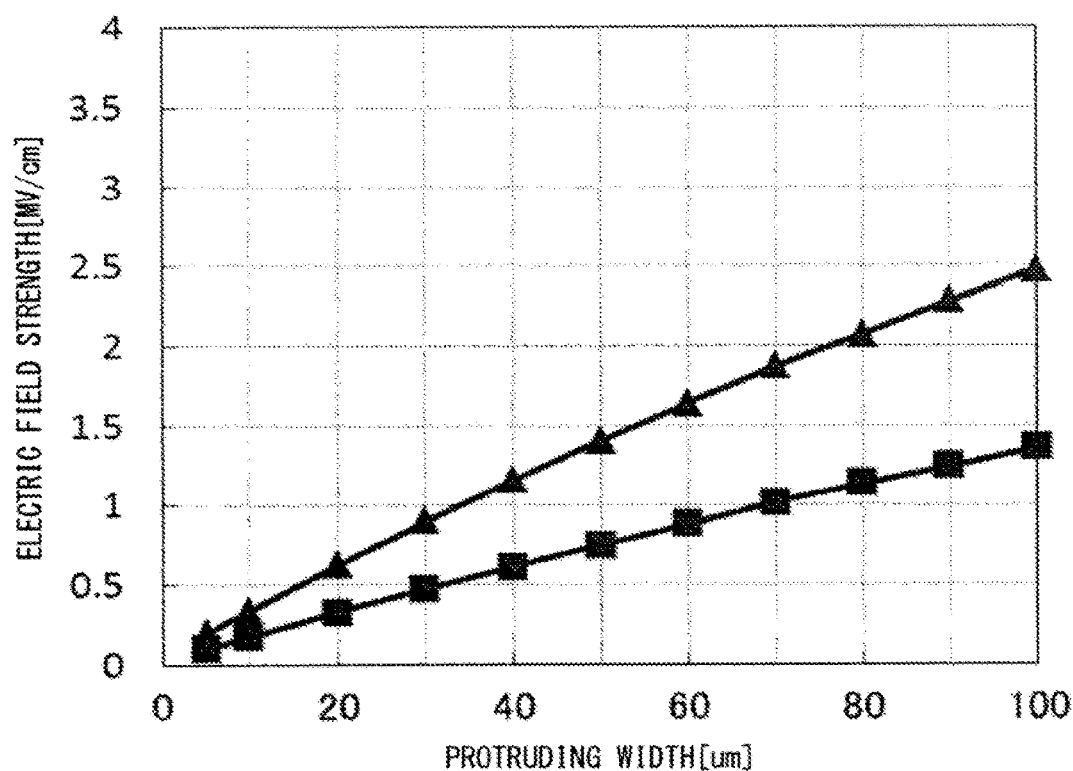
F I G . 7
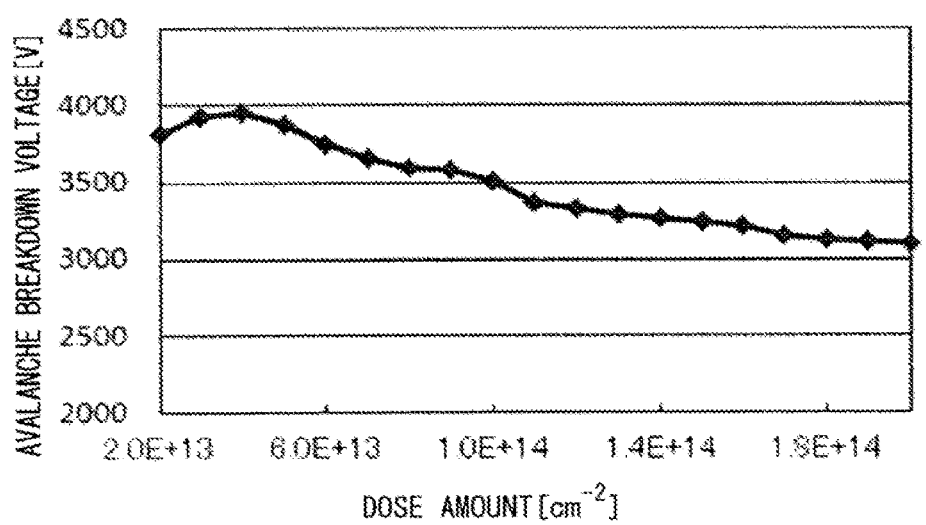

F I G . 8
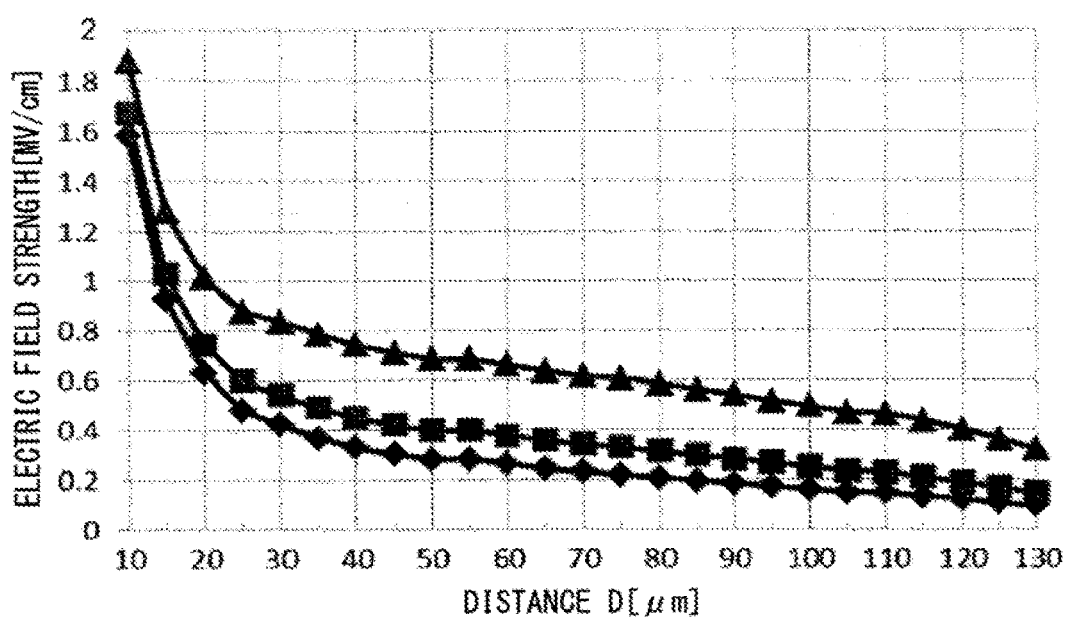

F I G . 1 0
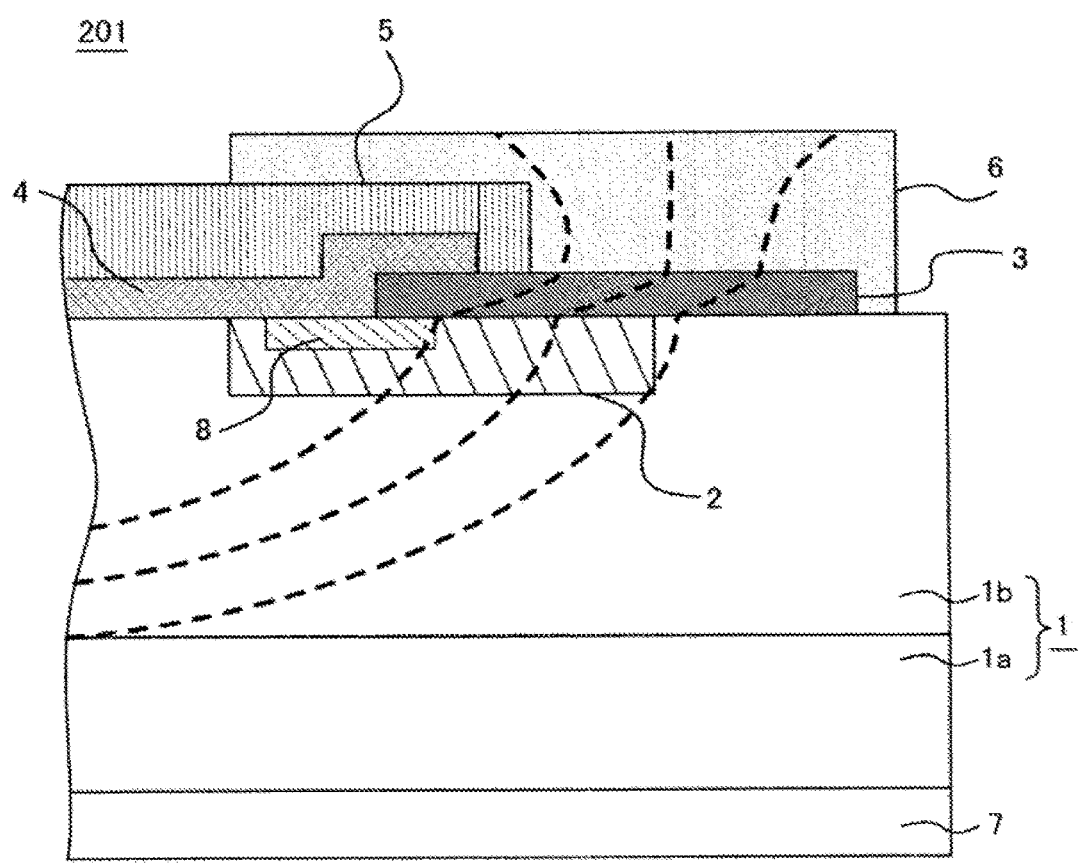

F I G . 1 1
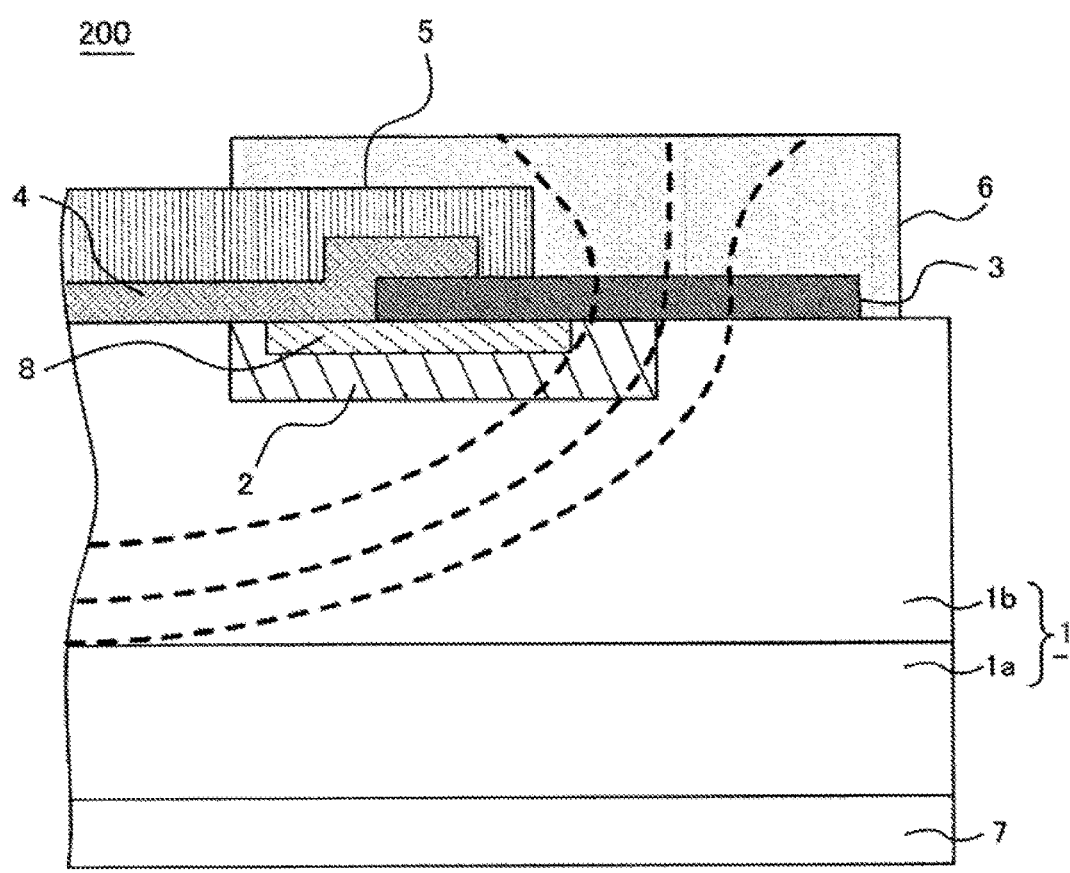

F I G. 1 2
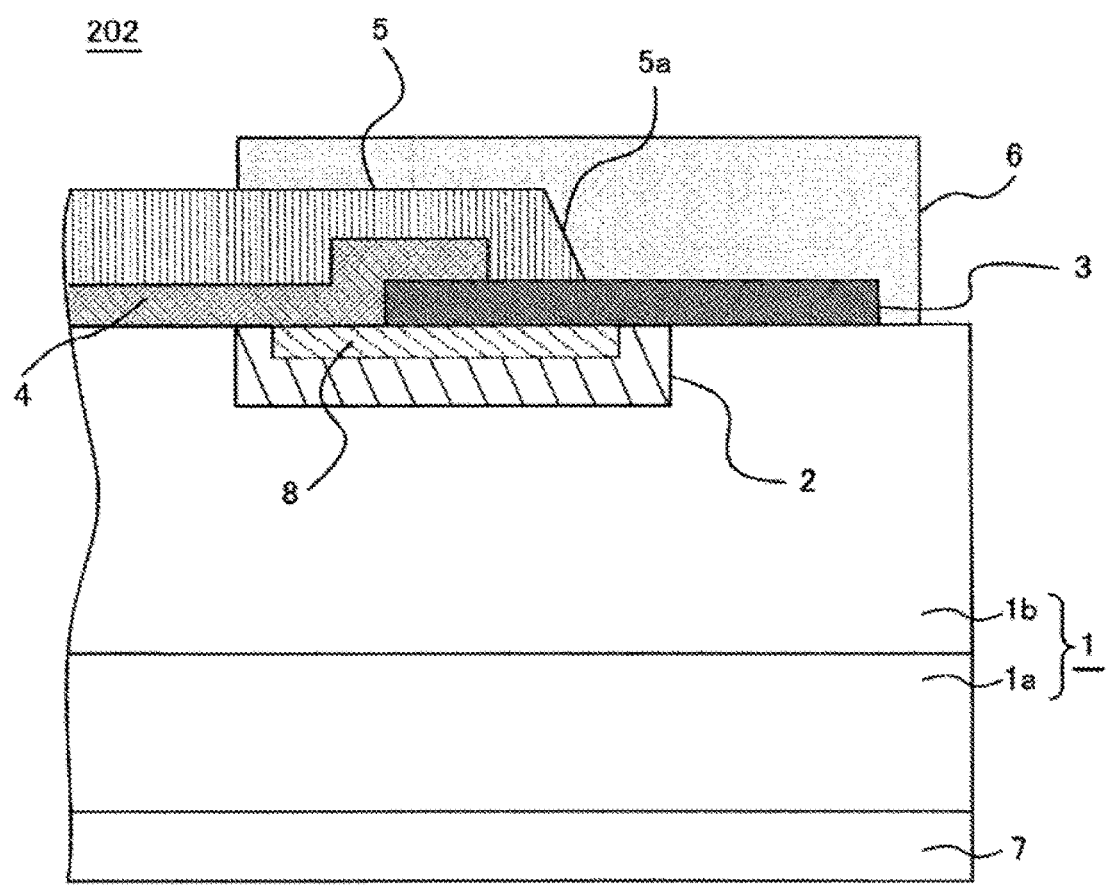

F I G . 1 3
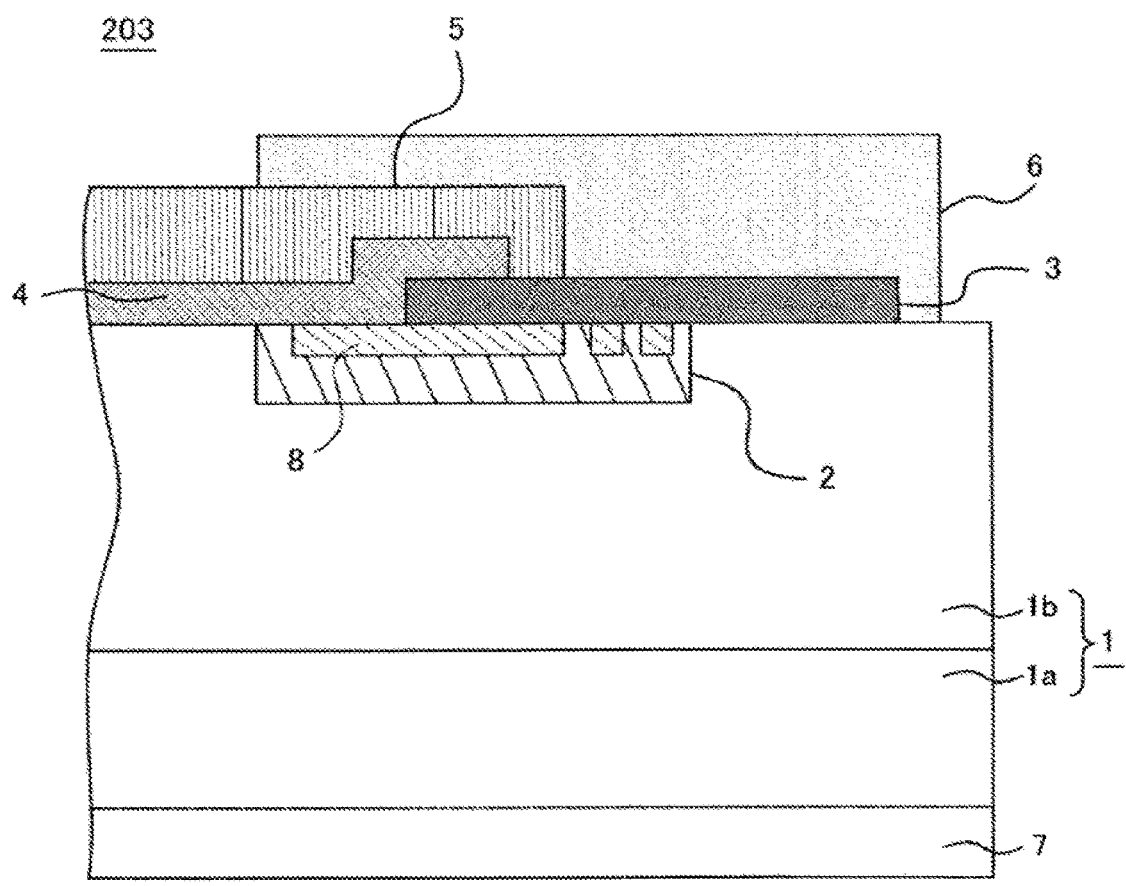

F I G . 1 4
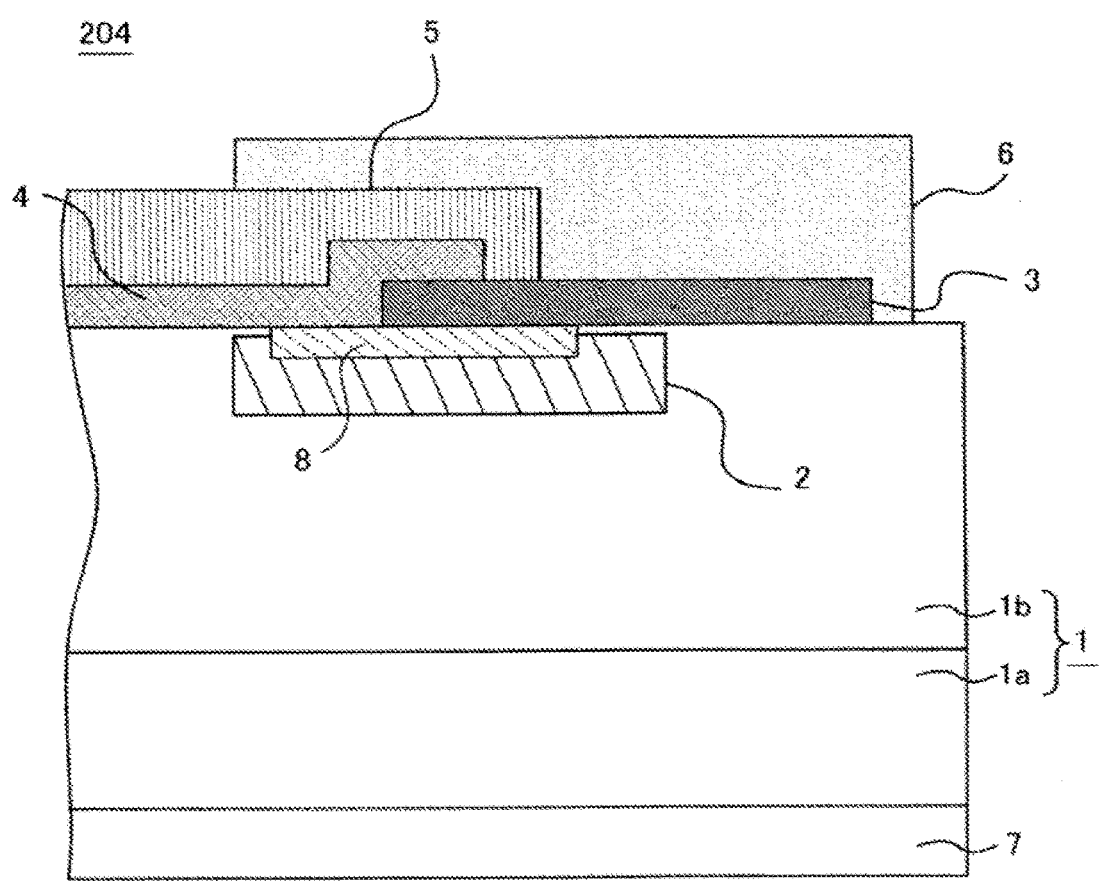

F I G . 1 5
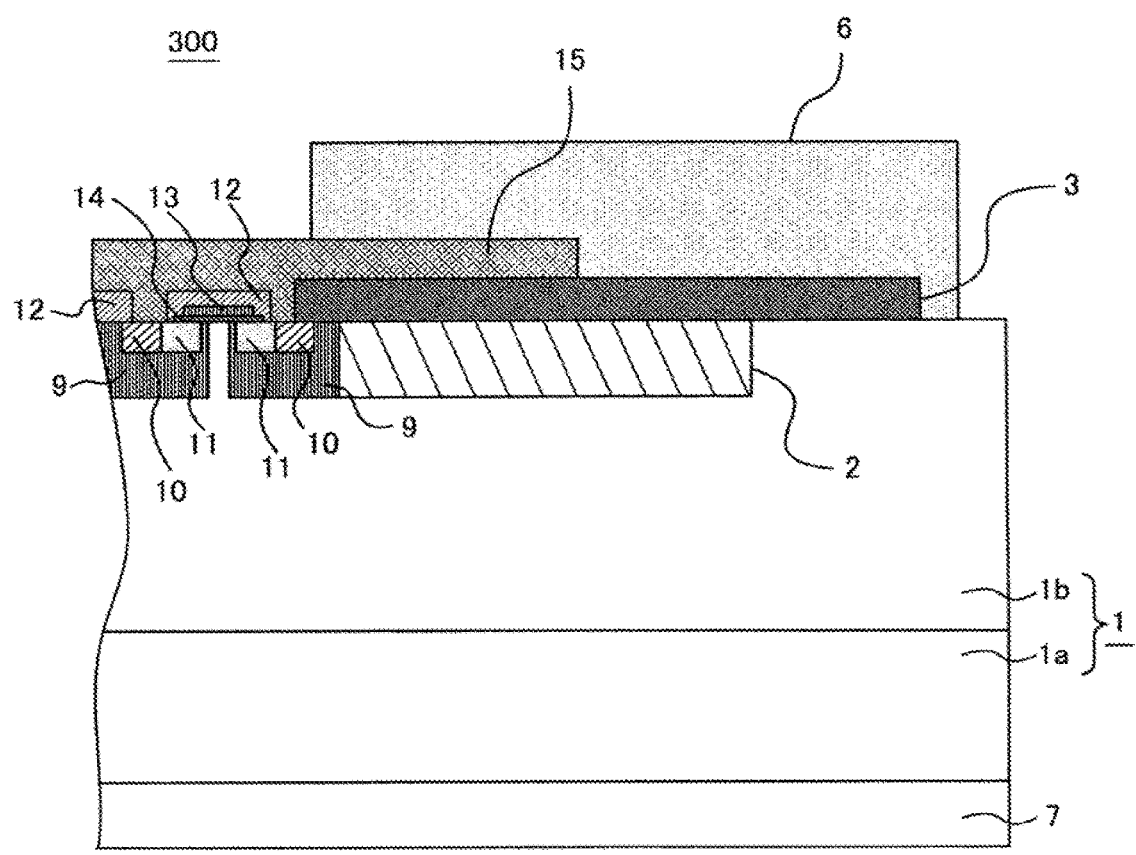

F I G . 1 6
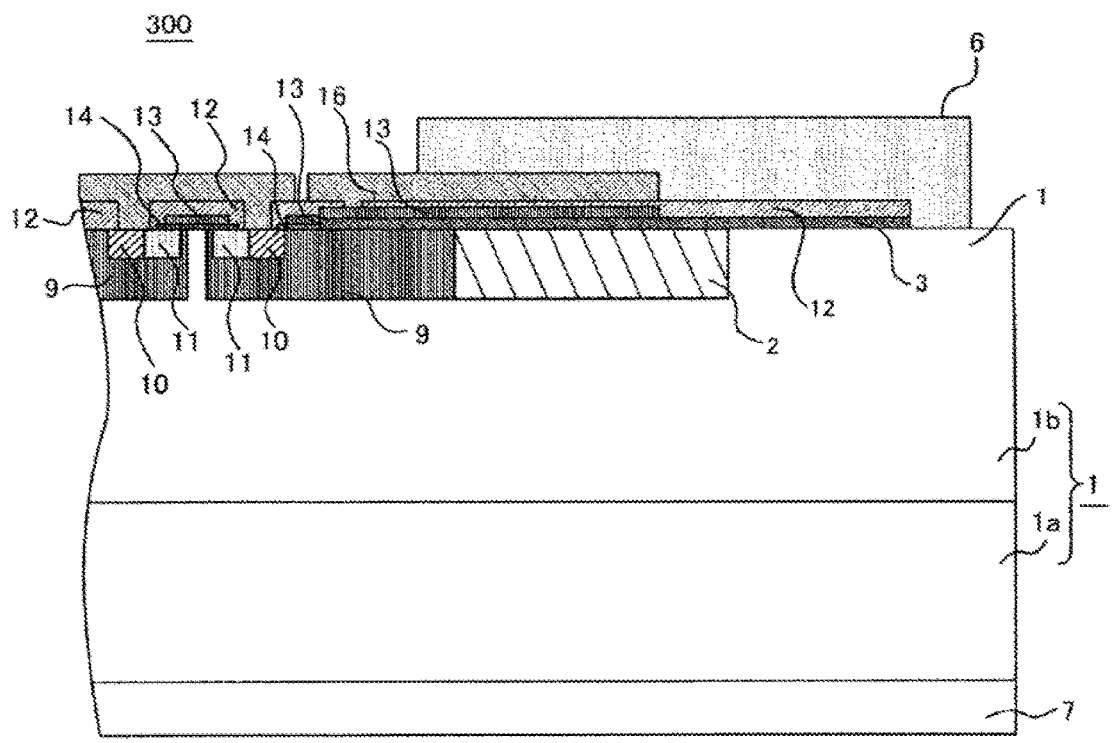

F I G . 1 7
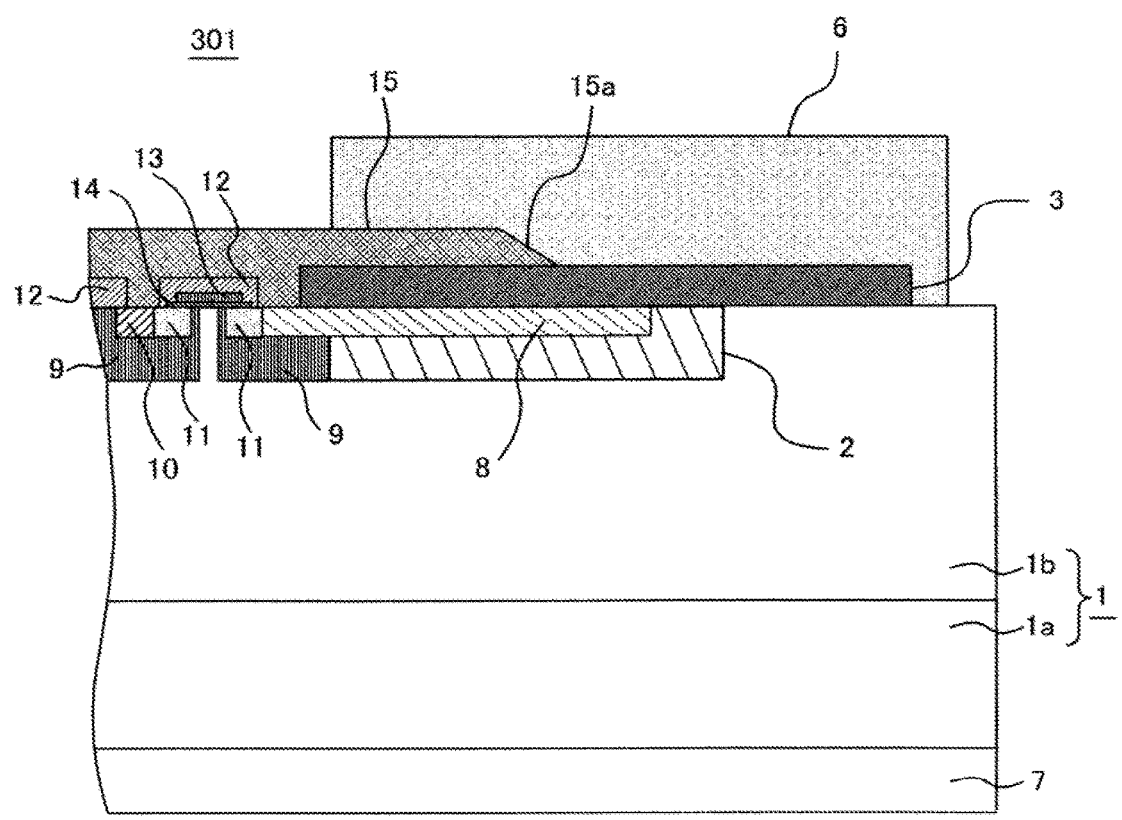

F I G . 1 8
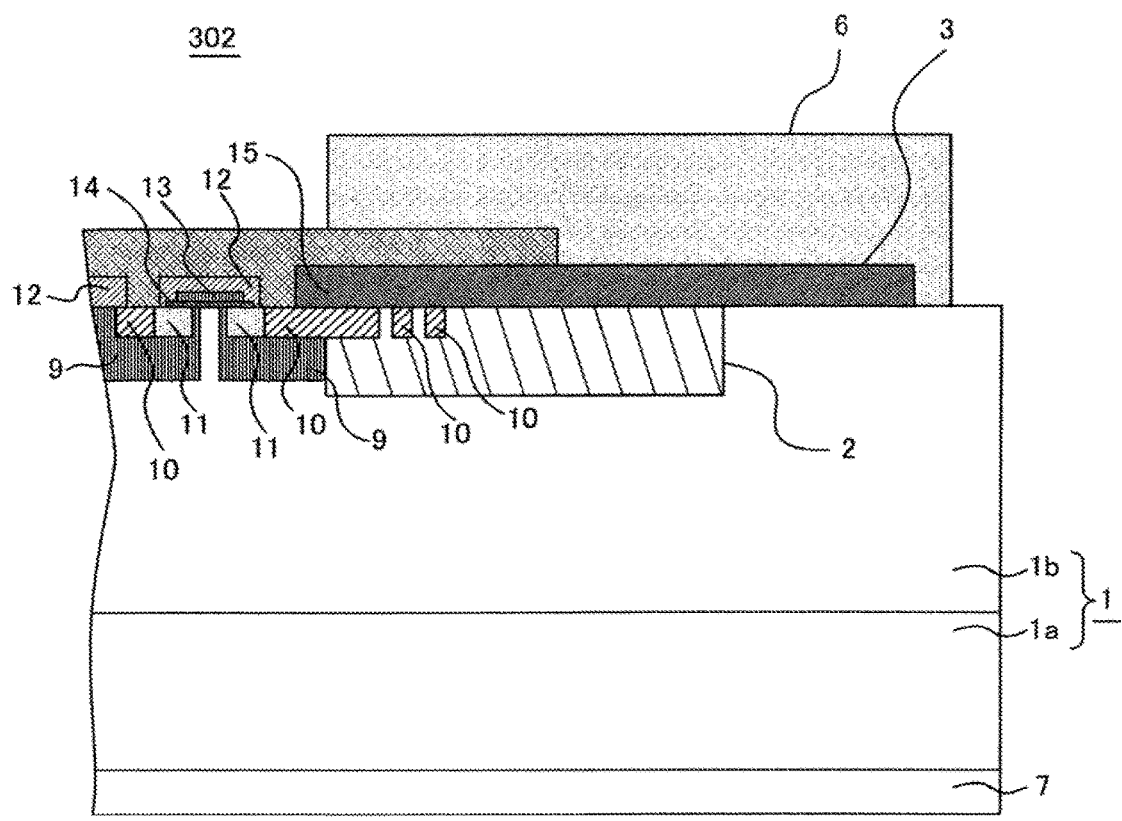

SILICON CARBIDE SEMICONDUCTOR DEVICE

TECHNICAL FIELD

The present invention relates to a silicon carbide semiconductor device.

BACKGROUND ART

In recent years, a semiconductor device prepared with silicon carbide (SiC) (hereinafter, referred to as "a silicon carbide semiconductor device") has been attracting attention as a next-generation semiconductor device with which high withstand voltage and low loss can be realized. Since the dielectric breakdown electric field strength of SiC is about 10 times as compared with silicon (Si) which has been used for a conventional semiconductor device, in particular, the silicon carbide semiconductor device has been expected to be applied to power semiconductor devices of high withstand voltage.

With regard to the silicon carbide semiconductor device, for the purpose of attaining further enhancement in withstand voltage, it has been known that, by providing a so-called terminal end region within an N type silicon carbide semiconductor layer with a P type guard ring region (terminal end well region), the electric field at the time of being applied with reverse voltage by a depletion layer, which is formed by a PN junction of the silicon carbide semiconductor layer and the guard ring region, is relaxed (for example, Patent Document 1). Moreover, in a Schottky barrier diode composed of SiC (SiC-SBD) described in Patent Document 1, a field insulation film is provided on a silicon carbide semiconductor layer in a terminal end region, and the outer peripheral end of a surface electrode is formed so as to run on the field insulation film.

On the other hand, with regard to an SiC-SBD, there are cases where an etching residue is formed at the outer peripheral end of a Schottky electrode (a first surface electrode), which is provided on the silicon carbide semiconductor layer and the field insulation film, and there is a fear that failures of the silicon carbide semiconductor device are caused because electric field concentration occurs around an etching residue when the etching residue is formed. On that account, it has been known that, by covering the outer peripheral end of a Schottky electrode with an electrode pad (a second surface electrode), which is provided on the Schottky electrode, failures of the silicon carbide semiconductor device are suppressed (see, for example, Patent Document 2) because an etching residue formed at the outer peripheral end of a Schottky electrode is not exposed.

PRIOR ART DOCUMENTS

Patent Documents

Patent Document 1: Japanese Translation of PCT Publication No. 2006-516815
Patent Document 2: Japanese Patent Application Laid-Open No. 2013-211503

SUMMARY OF INVENTION

Problems to be Solved by the Invention

However, when the outer peripheral end of a Schottky electrode is covered with an electrode pad, the outer peripheral end of the electrode pad protrudes to the outer peripheral side on the field insulation film, and then, the present inventors have newly found that, when the protruding width of the electrode pad becomes large, the electric field around the outer peripheral end of the electrode pad is increased at the time of switching, the dielectric breakdown of a surface protective film which covers the outer peripheral end of the field insulation film or the electrode pad occurs, and there is a fear that element failures are caused. It is presumed that electric field concentration which occurs at the outer peripheral end of the electrode pad at the time of switching thus described is caused by such a mechanism described below.

As described above, with regard to a silicon carbide semiconductor device in an off-state, namely, a static state of being applied with a constant voltage, a depletion layer is made to extend from a terminal end well region provided in a terminal end region and the voltage is held to attain electric field relaxation, but there are cases where the electric field relaxation effect by the terminal end well region is not sufficiently exerted when the extension of the depletion layer from the terminal end well region is delayed since a high voltage is applied at a high rate in a switching state of switching the silicon carbide semiconductor device from the on-state to the off-state. In particular, the extension of the depletion layer from the terminal end well region is delayed against a voltage applied at a high rate at the time of switching and the electric field relaxation effect is not sufficiently exerted because the silicon carbide semiconductor device enables switching at a higher rate than that of a silicon semiconductor device of the same withstand voltage and has an acceptable level deeper than that of a conventional silicon semiconductor device, causing the extension of the depletion layer to be delayed. And then, in the case where a voltage fails to be sufficiently held at the outer peripheral side of the terminal end well region, an equipotential line enters the inside of the terminal end well region, and in this case, when the outer peripheral end of the electrode pad protrudes to the outer peripheral side on the field insulation film, there has been a fear that element failures are caused because the density of equipotential lines around an electrode pad constituting a corner part is heightened and electric field concentration occurs at the outer peripheral end of a surface electrode.

Although it is thought that, in order to prevent the lowering in the electric field relaxation effect due to a terminal end well region at the time of switching thus described, a P type dose amount in the terminal end well region is made to increase to promote the extension of a depletion layer, there has been a fear that the lowering in withstand voltage is caused because the electric field thereof in a static off-state is increased when the P type dose amount in the terminal end well region is optimized in view of the electric field relaxation at the time of switching. That is, in the conventional silicon carbide semiconductor device, it is difficult to achieve both electric field relaxation thereof in a static off-state and electric field relaxation at the time of dynamic switching, and it has been difficult to sufficiently enhance the withstand voltage.

The present invention has been made in view of solving the above-described problems and is aimed at providing a silicon carbide semiconductor device with which the electric field at the time of switching is relaxed and the element withstand voltage can be enhanced while suppressing an increase in electric field thereof in the off-state.

Means for Solving the Problems

The silicon carbide semiconductor device according to the present invention includes a first conductivity-type silicon carbide substrate having an inner peripheral side toward an active area region and an outer peripheral side toward a termination area region, a field insulation film which is formed on the surface of the silicon carbide substrate, a first surface electrode which is formed farther towards the inner peripheral side than the field insulation film on the surface of the silicon carbide substrate and extends above at least a portion of the field insulation film, a second surface electrode which covers the first surface electrode and extends beyond an outer peripheral end of the first surface electrode onto the field insulation film, and an outer peripheral end of the second surface electrode extends beyond an inner peripheral end of the field insulation film by a protruding width, a second conductivity-type terminal end well region which is brought into contact with at least a part of the first surface electrode at an upper part within the silicon carbide substrate and extends to the outer peripheral side farther than the outer peripheral end of the second surface electrode within the silicon carbide substrate, a surface protective film which is formed on the field insulation film and on the second surface electrode so as to cover the outer peripheral end of the second surface electrode and is composed of an insulation material, and a back electrode which is formed on the back surface of the silicon carbide substrate, and the protruding width is selected so that an electric field strength applied to the outer peripheral lower end of the second surface electrode becomes equal to the smaller dielectric breakdown strength among dielectric breakdown strengths of an insulation material constituting the field insulation film and an insulation material constituting a surface protection film.

Effects of the Invention

According to the silicon carbide semiconductor device of the present invention, even if the extension of a depletion layer from the terminal end well region at the time of switching is delayed and an equipotential line enters the inside of the terminal end well region, since the outer peripheral end of the second surface electrode is situated at the inner peripheral side so that the electric field strength applied to the outer peripheral lower end of the second surface electrode becomes smaller than the dielectric breakdown strength of each of the field insulation film and the surface protective film, it is possible to reduce the density of equipotential lines around the outer peripheral end of the second surface electrode and to suppress the electric field around the outer peripheral end of the second surface electrode at the time of switching while suppressing an increase in electric field thereof in an off-state.

BRIEF DESCRIPTION OF DRAWINGS

FIG. 1 is a sectional view showing the configuration of a silicon carbide semiconductor device in accordance with Embodiment 1 of the present invention.

FIG. 2 is a sectional view showing the configuration of a silicon carbide semiconductor device in accordance with a comparative example of Embodiment 1 of the present invention.

FIG. 3 is a sectional view showing the configuration of a silicon carbide semiconductor device in accordance with a comparative example of Embodiment 1 of the present invention.

FIG. 4 is a sectional view showing the configuration of a silicon carbide semiconductor device in accordance with Embodiment 1 of the present invention.

FIG. 5 is a graph showing the simulation result in accordance with Embodiment 1 of the present invention.

FIG. 6 is a graph showing the simulation result in accordance with Embodiment 1 of the present invention.

FIG. 7 is a graph showing the simulation result in accordance with Embodiment 1 of the present invention.

FIG. 8 is a graph showing the simulation result in accordance with Embodiment 1 of the present invention.

FIG. 10 is a sectional view showing the configuration of a silicon carbide semiconductor device in accordance with a comparative example of Embodiment 2 of the present invention.

FIG. 11 is a sectional view showing the configuration of a silicon carbide semiconductor device in accordance with Embodiment 2 of the present invention.

FIG. 12 is a sectional view showing the configuration of a modified example of the silicon carbide semiconductor device in accordance with Embodiment 2 of the present invention.

FIG. 13 is a sectional view showing the configuration of a modified example of the silicon carbide semiconductor device in accordance with Embodiment 2 of the present invention.

FIG. 14 is a sectional view showing the configuration of a modified example of the silicon carbide semiconductor device in accordance with Embodiment 2 of the present invention.

FIG. 15 is a sectional view showing the configuration of a silicon carbide semiconductor device in accordance with Embodiment 3 of the present invention.

FIG. 16 is a sectional view showing the configuration of a silicon carbide semiconductor device in accordance with Embodiment 3 of the present invention.

FIG. 17 is a sectional view showing the configuration of a silicon carbide semiconductor device in accordance with a modified example of Embodiment 3 of the present invention.

FIG. 18 is a sectional view showing the configuration of a silicon carbide semiconductor device in accordance with a modified example of Embodiment 3 of the present invention.

DESCRIPTION OF EMBODIMENTS

Figure 9:
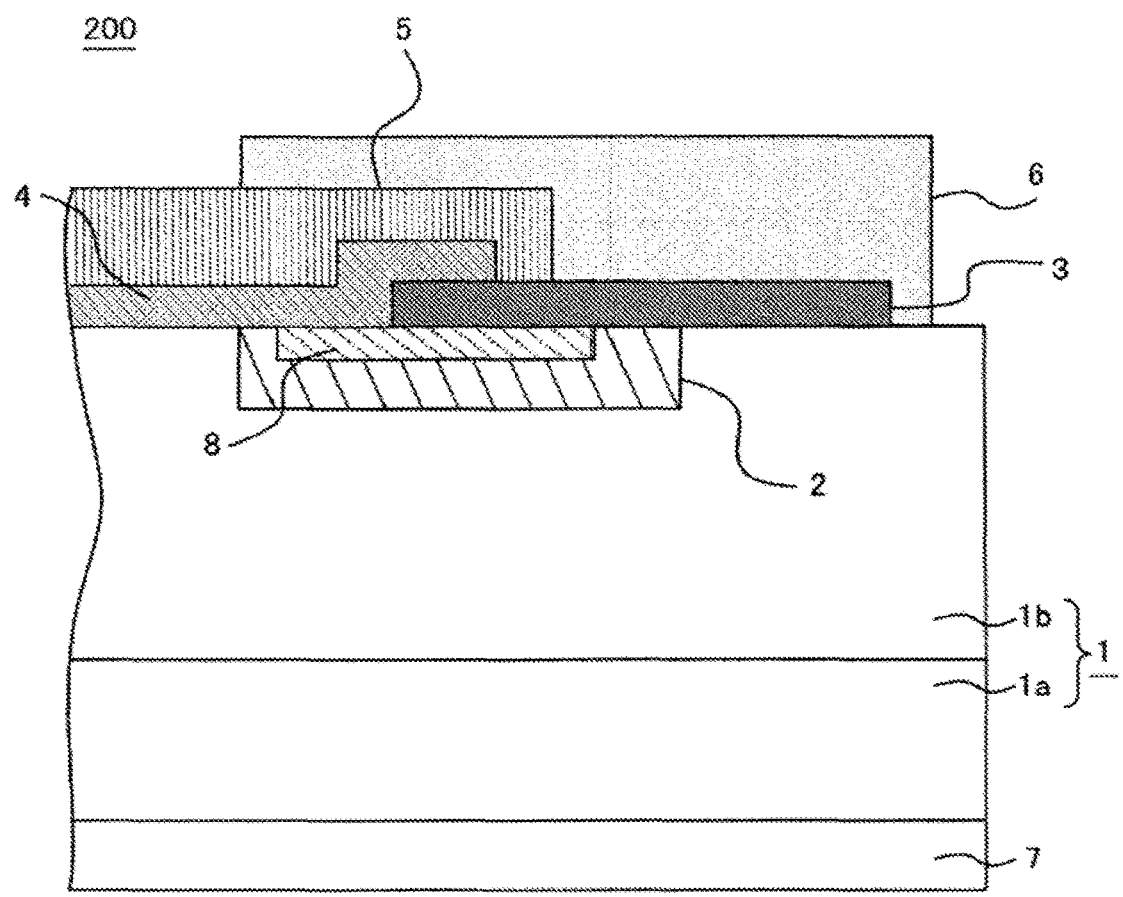
FIG. 9 is a sectional view showing the configuration of a silicon carbide semiconductor device in accordance with Embodiment 2 of the present invention.

In the present specification, "the amount of impurities [$cm^{-2}$] per unit area" in respective regions refers to a value calculated by integrating the impurity concentration in respective regions in the depth direction. Moreover, in the case where the impurity concentration in respective regions has a concentration profile, "the impurity concentration [$cm^{-3}$]" in respective regions refers to a peak value of the impurity concentration in respective regions, and in the case where the impurity concentration in respective regions has a concentration profile, "the thickness" in respective regions is defined as the thickness of a region where a value of the impurity concentration becomes greater than or equal to one-tenth of the peak value of the impurity concentration in the region. However, "the impurity concentration" at the time of calculating "the dose amount [$cm^{-2}$]" in respective regions is defined as an actual impurity concentration instead of a peak value of the impurity concentration.

Moreover, in the present specification, in the case of "a constituent element on (above) another constituent element", this does not interfere with the existence of an interposed object between the constituent elements. For example, in the case of a description of "B provided on A", both of the case where another constituent element C is interposed between A and B and the case where another constituent element C is not interposed between A and B are included therebetween.

Embodiment 1

First, the configuration of a silicon carbide semiconductor device 100 in accordance with Embodiment 1 of the present invention will be described. Hereinafter, an N type SiC-SBD (Silicon Carbide Schottky Barrier Diode) in which the first conductivity-type is defined as the N type and the second conductivity-type is defined as the P type will be exemplified to be explained, but a P type silicon carbide semiconductor device in which the first conductivity-type is defined as the P type and the second conductivity-type is defined as the N type may be adopted and a PN diode or a PiN diode may be adopted instead of the SBD.

FIG. 1 is a sectional view showing the configuration of the silicon carbide semiconductor device 100 in accordance with Embodiment 1. In FIG. 1, only a cross sectional portion around the terminal end region of the silicon carbide semiconductor device 100 is illustrated, and in FIG. 1, the right side is the terminal end region side situated at the right end part of the silicon carbide semiconductor device 100 and the left side is the active region side thereof in an on-state through which the main current flows.

In FIG. 1, the silicon carbide semiconductor device 100 is an SiC-SBD provided with a silicon carbide substrate 1, a field insulation film 3, a Schottky electrode 4 which is a first surface electrode, an electrode pad 5 which is a second surface electrode, a surface protective film 6 and a back electrode 7. The silicon carbide substrate 1 is composed of a substrate layer 1a made of N+ type silicon carbide and an N− type silicon carbide semiconductor layer 1b (drift layer) formed on the substrate layer 1a. In a so-called terminal end region at an upper part within the silicon carbide semiconductor layer 1b, a P type terminal end well region 2 is formed.

As the N type impurity contained in the silicon carbide substrate 1, nitrogen (N) and phosphorus (P) can be used, as the P type impurity, aluminum (Al) and boron (B) can be used, and in the present embodiment, nitrogen is adopted as the N type impurity and aluminum is adopted as the P type impurity. The N type impurity concentration of the silicon carbide semiconductor layer 1b is lower than the N type impurity concentration of the substrate layer 1a, and the N type impurity concentration of the silicon carbide semiconductor layer 1b and the thickness thereof are set depending on a designed withstand voltage of the silicon carbide semiconductor device 100. For example, the N type impurity concentration thereof can be set to $1.0 \times 10^{14}/cm^3$ to $1.0 \times 10^{16}/cm^3$, and in the present embodiment, the N type impurity concentration of the silicon carbide semiconductor layer 1b is set to $8.0 \times 10^{15}/cm^3$. It is preferred that the dose amount of the P type impurity in the terminal end well region 2 be set to $1.0 \times 10^{13}/cm^2$ to $1.0 \times 10^{14}/cm^2$, the dose amount thereof is more preferably set to $2.0 \times 10^{13}/cm^2$ to $5.0 \times 10^{13}/cm^2$, and in the present embodiment, the dose amount thereof is set to $2.0 \times 10^{13}/cm^2$.

On the surface of the silicon carbide substrate 1 (silicon carbide semiconductor layer 1b), the field insulation film 3 and the Schottky electrode 4 are formed. The Schottky electrode 4 is formed at the center portion (left side in FIG. 1) on the surface of the silicon carbide semiconductor layer 1b and is Schottky-connected to the silicon carbide semiconductor layer 1b. The field insulation film 3 is formed on a so-called terminal end region at the outer peripheral side more than the Schottky electrode 4 on the surface of the silicon carbide semiconductor layer 1b, and when planarly viewed, the Schottky electrode 4 surrounds a part Schottky-connected to the silicon carbide semiconductor layer 1b. A portion of the Schottky electrode 4 is situated on the terminal end well region 2 and is brought into contact with the terminal end well region 2. Moreover, the Schottky electrode 4 is formed so as to run on the field insulation film 3, and the outer peripheral end of the Schottky electrode 4 is situated on the field insulation film 3.

Moreover, for the field insulation film 3, silicon oxide ($SiO_2$) and silicon nitride (SiN) can be used, and for example, the thickness can be set to 0.5 µM to 3.0 µm. In the present embodiment, as the field insulation film 3, an $SiO_2$ film with a thickness of 1.0 µm is used. The Schottky electrode 4 needs only to be made of a metal which is Schottky-connected to the silicon carbide semiconductor, titanium, molybdenum, nickel, gold, tungsten and the like can be used, and for example, the thickness can be set to 30 nm to 300 nm. In the present embodiment, as the Schottky electrode 4, a titanium film with a thickness of 200 nm is used.

On the Schottky electrode 4, the electrode pad 5 is formed, and the electrode pad 5 covers the outer peripheral end of the Schottky electrode 4. That is, the outer peripheral end of the electrode pad 5 is situated beyond the outer peripheral end of the Schottky electrode 4 onto the field insulation film 3. For the electrode pad 5, a metal containing any one of aluminum, copper, molybdenum and nickel, an aluminum alloy such as Al—Si, and the like can be used, and for example, the thickness can be set to 300.0 nm to 10.0 µm. In the present embodiment, as the electrode pad 5, an aluminum layer with a thickness of 5.0 µm is used.

Furthermore, the outer peripheral end of the electrode pad 5 is situated above the terminal end well region 2, and the outer peripheral end position of the electrode pad 5 is adjusted so that the distance in the horizontal direction from the inner peripheral end of the field insulation film 3 to the outer peripheral end of the electrode pad 5 (hereinafter, referred to as "the protruding width of the electrode pad 5") becomes greater than 0 µm and less than or equal to 100 µm. In this connection, at the time of calculating the protruding width of the electrode pad 5, in the case where the end face of an outer peripheral end of the electrode pad 5 or an inner peripheral end of the field insulation film 3 is inclined, the outer peripheral lower end of the electrode pad 5 or the inner peripheral lower end of the field insulation film 3 is used as a reference (the same holds true for another protruding width described below).

On the field insulation film 3 and the electrode pad 5, the surface protective film 6 is formed. The surface protective film 6 is formed so as to cover the outer peripheral end of the electrode pad 5 and has an opening above the center portion of the electrode pad 5 to make a connection with an external terminal. Moreover, in order to relax the stress received from the external environment, it is desirable that the surface protective film 6 be an organic resin film, and in the present embodiment, polyimide is used as the surface protective film 6.

The back electrode 7 is formed at the back surface side of the silicon carbide substrate 1 (substrate layer 1a). The back electrode 7 is ohmic-connected to the substrate layer 1a. As such, for the back electrode 7, metals such as nickel, aluminum and molybdenum which can be ohmic-connected to silicon carbide constituting the substrate layer 1a can be used, and in the present embodiment, nickel is used.

Next, a production method of the silicon carbide semiconductor device 100 will be described.

A silicon carbide substrate 1 constituted of an N+ type substrate layer 1a and an N− type silicon carbide semiconductor layer 1b subjected to epitaxial crystal growth on the upper surface of the substrate layer 1a is prepared. And then, by a known method, for example, a photo-engraving technique, a resist film is patterned into a prescribed shape. Afterward, P type impurities are selectively ion-injected from above the resist film to form a P type terminal end well region 2 (guard ring region) at an upper part within the silicon carbide semiconductor layer 1b.

In this context, for example, aluminum ions or boron ions as impurity ions are injected into a P type impurity region, the impurity ions are electrically activated by being subjected to annealing at a high temperature of 1500° C. or higher after ion injection, and a prescribed conductivity-type region is formed. In this connection, as described above, it is preferred that the dose amount of the P type impurity in the terminal end well region 2 be set to $1.0 \times 10^{13}/cm^2$ to $1.0 \times 10^{14}/cm^2$, the dose amount thereof is more preferably set to $2.0 \times 10^{13}/cm^2$ to $5.0 \times 10^{13}/cm^2$, and in the present embodiment, the dose amount thereof is set to $2.0 \times 10^{13}/cm^2$.

Moreover, with regard to ion injection of the P type impurity, for example, the injection energy is set to 100 keV to 700 keV. In this case, when the dose amount [$cm^{-2}$] of the P type impurity in respective regions described above is converted into the impurity concentration [$cm^{-3}$], the impurity concentration in the terminal end well region 2 is determined to be $1.0 \times 10^{17}/cm^3$ to $1.0 \times 10^{19}/cm^3$.

Subsequently, for example, by a CVD method, a silicon oxide film with a thickness of 1.0 μm is deposited on the surface of the silicon carbide semiconductor layer 1b, after which, by photo-engraving and etching, a center portion of the silicon oxide film is removed to form a field insulation film 3 having an opening part. The opening end of the field insulation film 3 is formed so as to be situated above the terminal end well region 2. And then, a back electrode 7 is formed at the back surface side of the substrate layer 1a of the silicon carbide substrate 1. In this connection, the formation of the back electrode 7 may be performed after all of the steps for the surface side of the silicon carbide substrate 1 described below are completed.

Next, for example, by a sputtering method, on the whole face of the surface of the silicon carbide semiconductor layer 1b on which the field insulation film 3 is formed, a kind of metal is formed into a metal film constituting a Schottky electrode 4. In the present embodiment, a titanium film with a thickness of 200 nm is adopted as the metal film formed. Furthermore, by a photo-engraving technique, a resist film with a prescribed pattern shape is formed. Afterward, the resist film is made to serve as a mask and the metal film is etched to form a Schottky electrode 4 with a desired shape. Although dry etching or wet etching can be used in the etching of the metal film, it is desirable that wet etching be used in order to alleviate the damage to a chip, and for example, hydrofluoric acid (HF) is used as an etchant.

Subsequently, an electrode pad 5 is formed on the field insulation film 3 and the Schottky electrode 4 so as to cover the Schottky electrode 4. As in the case of the formation of the Schottky electrode 4, the formation of the electrode pad 5 can be achieved by forming a prescribed metal film on the whole face and then etching the film, and for example, the etching of the metal film is performed by wet etching using a phosphoric acid-based etchant. Afterward, a surface protective film 6 is formed so as to cover the electrode pad 5 to complete the silicon carbide semiconductor device 100 in accordance with the present embodiment.

Next, the operation of the silicon carbide semiconductor device 100 in accordance with the present embodiment will be described. In the silicon carbide semiconductor device in accordance with the present embodiment, when the back electrode 7 is applied with a negative voltage against surface electrodes (the Schottky electrode 4 and the electrode pad 5), a current flows from the surface electrode to the back electrode 7, and the silicon carbide semiconductor device 100 becomes a conduction state (on-state). On the other hand, when the back electrode 7 is applied with a positive voltage against the surface electrode, a current is blocked by the Schottky junction between the Schottky electrode 4 and the silicon carbide semiconductor layer 1b and the PN junction between the terminal end well region 2 and the silicon carbide semiconductor layer 1b, and the silicon carbide semiconductor device 100 becomes a blocked state (off-state).

Hereinafter, the action/effect of the silicon carbide semiconductor device 100 in accordance with the present embodiment will be described.

Unlike the present embodiment, in the case where the field insulation film 3 is not provided and the whole face of the Schottky electrode 4 is formed onto the silicon carbide semiconductor layer 1b, the curvature of an equipotential surface becomes large around the end part of a junction surface between the Schottky electrode 4 and the silicon carbide semiconductor layer 1b, and electric field concentration occurs around the outer peripheral end of the Schottky electrode 4. As such, like the present embodiment, by adopting such a configuration that the Schottky electrode 4 is made to run on the field insulation film 3, it is possible to relax the electric field concentration at the outer peripheral end of the Schottky electrode 4. Furthermore, in the case where the field insulation film 3 is provided, since the alignment margin of the outer peripheral end of the Schottky electrode 4 and the opening end of the field insulation film 3 can be enlarged by forming the Schottky electrode 4 so as to run on the field insulation film 3, it is possible to simplify the production process.

Moreover, at the outer peripheral end of the Schottky electrode 4, an etching residue is formed, and there is a fear that electric field concentration occurs around the etching residue, resulting in a problem. Although the etching residue can be generated even in the case where either the Schottky electrode 4 or the electrode pad 5 is etched and can be generated in either case of dry etching or wet etching, based on the relationship between the thickness of a metal film or the material for a metal film and an etchant, the etching residue is particularly liable to be generated at the time of forming the Schottky electrode 4. And then, depending on the shape of an etching residue and the like, there has been a fear that the reliability of the silicon carbide semiconductor device is lowered due to electric field concentration which occurs at the outer peripheral end part of the Schottky electrode 4.

In the present embodiment, since the electrode pad 5 is formed so as to cover the outer peripheral end of the Schottky electrode 4, an etching residue formed at the outer peripheral end of the Schottky electrode 4 is not exposed. As such, even if an etching residue is generated on the Schottky electrode 4, there is no fear that the electric field at the end part of the Schottky electrode 4 causes a problem. On the other hand, in the case where the end part (etching residue) of the Schottky electrode 4 is covered with the electrode pad 5, instead of an etching residue part of the Schottky electrode 4, the outer peripheral end of the electrode pad 5 becomes an electric field concentration point, but the etching residue is hardly formed on the electrode pad 5 as compared with the Schottky electrode 4, and even if an etching residue is formed thereon, it is possible to relax the electric field concentration at the electrode end part since the etching residue formed thereon does not have a sharp shape as compared with the etching residue formed on the Schottky electrode 4.

Furthermore, like the present embodiment, in the case where the Schottky electrode 4 is covered with the electrode pad 5, the outer peripheral end of the electrode pad 5 protrudes to the outer peripheral side more than the outer peripheral end of a conventional one, and it is necessary to adjust the position of the outer peripheral end of the electrode pad 5 in view of the following viewpoint.

FIG. 2 and FIG. 3 are sectional views showing a comparative example of a silicon carbide semiconductor device 101 in accordance with the present embodiment. Moreover, FIG. 4 is a sectional view showing the silicon carbide semiconductor device 100 in accordance with the present embodiment. In FIG. 2 to FIG. 4, curved lines shown by a broken line schematically illustrate equipotential lines at the time when the back electrode 7 is applied with a high voltage, FIG. 2 shows equipotential lines in a static off-state after the back electrode 7 is applied with a high voltage, and FIG. 3 and FIG. 4 show equipotential lines in a dynamic switching state at the time when the back electrode 7 is applied with a high voltage.

Like the present embodiment, in the silicon carbide semiconductor device prepared by providing the terminal end region with a terminal end well region functioning as a guard ring, equipotential lines become dense along the PN junction portion between the terminal end well region and the silicon carbide semiconductor layer since the voltage is held by a depletion layer formed between the terminal end well region and the silicon carbide semiconductor layer when the back electrode is applied with a high voltage and the silicon carbide semiconductor device is in an off-state. As shown in FIG. 2, in the static off-state, since P type impurity concentration of the terminal end well region 2 is higher than N type impurity concentration of the silicon carbide semiconductor layer 1b, mainly, a depletion layer is made to extend to the silicon carbide semiconductor layer 1b at the outer peripheral side more than the terminal end well region 2, and as a result, the portion where equipotential lines become dense is also shifted to the outer peripheral side more than the terminal end well region 2. Accordingly, there is no fear that an equipotential line wraps around the outer peripheral end of the electrode pad 5 and electric field concentration occurs at the outer peripheral end of the electrode pad 5 as long as the outer peripheral end of the electrode pad 5 is situated above the terminal end well region 2.

On the other hand, at the time of dynamic switching, there are cases where a depletion layer fails to sufficiently extend from the terminal end well region 2 to the silicon carbide semiconductor layer 1b side because ionization of the P type impurity within the terminal end well region 2 is delayed. In particular, in the silicon carbide semiconductor device, the acceptor level of the P type impurity is greater than or equal to 200 meV in the case of Al and is greater than or equal to 300 meV in the case of boron (B), and since the acceptor level of the P type impurity becomes several times or so deeper as compared with the case of silicon, ionization of the P type impurity is significantly delayed.

Furthermore, when semiconductor devices having the same level of withstand voltage are compared, it has been expected that a bipolar device prepared with silicon is substituted with a unipolar device prepared with silicon carbide, and for example, it is expected that such an SiC-SBD of the present embodiment is utilized instead of an Si—PN diode. On this occasion, in the SiC-SBD which is a unipolar device, the switching rate becomes higher than that of the Si—PN diode which is a bipolar device. As described above, in the silicon carbide semiconductor device, since the switching rate becomes higher as compared with a silicon semiconductor device having the same withstand voltage, a high voltage is applied at a higher rate than that in the conventional one.

As a result, in the silicon carbide semiconductor device, since ionization of the P type impurity is extremely delayed against the rate at which a high voltage is applied, an effective acceptor concentration in the terminal end well region 2 fails to be sufficiently secured, and a depletion layer formed between the terminal end well region 2 and the silicon carbide semiconductor layer 1b is made to extend to the terminal end well region 2 side. With this setup, as shown in FIG. 3, since a depletion layer intrudes into the terminal end well region 2 at the time of dynamic switching, the portion where equipotential lines become dense also intrudes into the inner peripheral side more than that in a static off-state. As such, the present inventors have newly found that, even if the outer peripheral end of the electrode pad 5 exists above the terminal end well region 2, an equipotential line wraps around the outer peripheral end of the electrode pad 5 depending on the position of the electrode pad 5 above the terminal end well region 2 and electric field concentration occurs at the outer peripheral end of the electrode pad 5. In particular, electric field concentration at the outer peripheral end of the electrode pad 5 becomes significant at the outer peripheral lower end of the electrode pad 5 where the curvature of an equipotential line becomes larger.

On that account, in the present embodiment, electric field relaxation at the outer peripheral end of the electrode pad 5 is attained by making the protruding width of the electrode pad 5 shorter than those in the comparative examples described in FIG. 2 and FIG. 3 in view of the electric field concentration at the outer peripheral end of the electrode pad 5 which occurs at the time of switching. With this setup, as shown in FIG. 4, even if a depletion layer intrudes into the terminal end well region 2 at the time of switching, since the density of equipotential lines around the outer peripheral end of the electrode pad 5 can be relaxed by reducing the protruding width of the electrode pad 5, it is possible to suppress electric field concentration applied to the outer peripheral end of the electrode pad 5.

The specific protruding width of the electrode pad 5 needs only to be set on the basis of the dielectric breakdown strengths of the field insulation film 3 and the surface protective film 6 which are brought into contact with the electrode pad 5. More specifically, the actual protruding width of the electrode pad 5 is made to be smaller than the protruding width of an electrode pad 5 at the time when the electric field strength applied to the outer peripheral lower end of the electrode pad 5 becomes equal to the smallest dielectric breakdown strength among the dielectric breakdown strength of the field insulation film 3 and the dielectric breakdown strength of the surface protective film 6. Hereinafter, a setting method of the protruding width of the electrode pad 5 will be described.

In FIG. 5, the results obtained in the case of calculating the electric field strength, which is applied to the outer peripheral end of the electrode pad 5 at the time when the protruding width of the electrode pad 5 is changed, by simulation are shown. In FIG. 5, the vertical axis indicates the electric field strength at the outer peripheral end of the electrode pad 5, the horizontal axis indicates the protruding width of the electrode pad 5, the filled diamond marker indicates the electric field strength obtained when the value of dV/dt is 0 kV/μs, namely, obtained in the static off-state, the outlined circle marker indicates the electric field strength obtained when the value of dV/dt is 10 kV/μs, the filled circle marker indicates the electric field strength obtained when the value of dV/dt is 20 kV/μs, and the filled triangle marker indicates the electric field strength obtained when the value of dV/dt is 50 kV/μs.

Moreover, although the electric field strength at the outer peripheral end of the electrode pad 5 in FIG. 5 refers to the electric field strength at the outer peripheral lower end of the electrode pad 5, actually, electric field strength at a point arranged at a distance of 10 nm from the outer peripheral lower end of the electrode pad 5 to the outer peripheral side in the horizontal direction is calculated because the lower end of the outer peripheral end of the electrode pad 5 is a singular point (the same holds true for another simulation result described below). In this connection, with regard to the configuration excluding the protruding width of the electrode pad 5 and the distance between the inner peripheral end of the field insulation film 3 and the outer peripheral end of the terminal end well region 2, the simulation model used for the simulation in FIG. 5 has the same configuration as that of the silicon carbide semiconductor device 100 in accordance with the present embodiment, the distance between the inner peripheral end of the field insulation film 3 and the outer peripheral end of the terminal end well region 2 is set to 140 μm, and the protruding width of the electrode pad 5 is changed in a range of 5 μm to 130 μm.

As shown in FIG. 5, in the static off-state where the value of dV/dt is 0 kV/μs, as described above, since the outer peripheral end of the electrode pad 5 is provided above the terminal end well region 2, electric field strength at the outer peripheral end of the electrode pad 5 becomes a sufficiently low value regardless of the protruding width. In this connection, in the simulation result in FIG. 5, specifically, the electric field strength in the case where the value of dV/dt is 0 kV/μs becomes a value of roughly several E+04 [V/cm] order.

On the other hand, as the value of dV/dt increases, electric field strength at the outer peripheral end of the electrode pad 5 increases, and when the value of dV/dt exceeds 10 kV/μs, the electric field strength is made to increase to a value of several [MV/cm] order depending on the value of the protruding width. As such, it is necessary to set the protruding width in view of the electric field strength at the time of switching. On that account, the protruding width is decided so that electric field strength which occurs at the outer peripheral end of the electrode pad 5 at the time of switching does not become higher than the smallest dielectric breakdown strength among the dielectric breakdown strengths of the field insulation film 3 and the surface protective film 6 with which the electrode pad 5 is brought into contact.

Like the present embodiment, in the case where the field insulation film 3 is formed of $SiO_2$ and the surface protective film 6 is formed of polyimide, since the dielectric breakdown strength of the surface protective film 6 generally becomes lower, the dielectric breakdown strength of polyimide used for the surface protective film 6 is used as a reference. In this context, the dielectric breakdown strength of polyimide is roughly 3.0 to 4.0 [MV/cm], and for example, when PIX-3400 (available from Hitachi Chemical DuPont MicroSystems L.L.C.) is used as polyimide, although the dielectric breakdown strength also varies with the curing time or the measurement method, the dielectric breakdown strength thereof becomes about 3.5 [MV/cm]. Thus, in the present embodiment, by setting the protruding width to 100 μm or less, even if the device is operated when the dV/dt is 50 kV/μs, the dielectric breakdown strength does not exceed the dielectric breakdown strength of polyimide by the electric field at the time of switching and it is possible to suppress dielectric breakdown of the surface protective film 6.

Moreover, since the smaller the electric field applied to the field insulation film 3 and the surface protective film 6 is, the more the lifetime of an insulation film can be prolonged, even if the electric field strength applied to the outer peripheral end of the electrode pad 5 is smaller than the dielectric breakdown strength of each of the field insulation film 3 and the surface protective film 6, it is desirable that the electric field at the outer peripheral end of the electrode pad 5 be further relaxed. And then, as shown in FIG. 5, the smaller the protruding width is, the larger the electric field relaxation effect by the reduction in protruding width becomes, and in the case where the value of dV/dt is 50 kV/μs, the amount dE/dL of change in the electric field strength E against the protruding width L is determined to be 567.6 [$MV/cm^2$] when the protruding width lies within the range of 5 to 30 μm, is determined to be 280 [$MV/cm^2$] when the protruding width lies within the range of 30 to 70 μm and is determined to be 126.7 [$MV/cm^2$] when the protruding width lies within the range of 70 to 100 μm, and the smaller the protruding width is, the more the electric field relaxation effect is increased.

As such, among protruding widths of the electrode pad 5 of 100 μm or less, it is more preferred that the protruding width thereof be set to 70 μm or less, it is further preferred that the protruding width thereof be set to 30 μm or less, it is possible to make the electric field strength at the outer peripheral end of the electrode pad 5 less than or equal to 3.5 [MV/cm] by setting the protruding width of the electrode pad 5 to 100 μm or less, it is possible to make the electric field strength at the outer peripheral end of the electrode pad 5 less than or equal to 3.0 [MV/cm] by setting the protruding width of the electrode pad 5 to 70 μm or less, and it is possible to make the electric field strength at the outer peripheral end of the electrode pad 5 less than or equal to 2.0 [MV/cm] by setting the protruding width of the electrode pad 5 to 30 μm or less.

Incidentally, even if ionization of the P type impurity is delayed at the time of switching, by increasing the dose amount of the P type impurity in the terminal end well region 2 in order to relax the electric field strength applied to the outer peripheral end of the electrode pad 5 at the time of switching, it is possible to sufficiently secure an effective acceptor concentration and to suppress intrusion of a depletion layer into the terminal end well region 2. With this setup, an equipotential line is prevented from wrapping around the outer peripheral end of the electrode pad 5, and it is considered that the electric field at the outer peripheral end of the electrode pad 5 can be relaxed.

In FIG. 6, the simulation results obtained by calculating the relationship between the protruding width of the electrode pad 5 and the electric field strength at the outer peripheral end thereof in the case where the dose amount of the P type impurity in the terminal end well region 2 is increased are shown. In FIG. 6, the vertical axis indicates the electric field strength at the outer peripheral end of the electrode pad 5, the horizontal axis indicates the protruding width of the electrode pad 5, the filled triangle marker indicates the electric field strength obtained when the dose amount of the P type impurity in the terminal end well region 2 is 1.0E14 [$cm^{-2}$], and the filled square marker indicates the electric field strength obtained when the dose amount of the P type impurity in the terminal end well region 2 is 2.0E14 [$cm^{-2}$]. In this connection, in the simulation shown in FIG. 6, the value of dV/dt is set to 100 kV/μs, in the simulation model shown in FIG. 6, the thickness of the silicon carbide semiconductor layer 1b and the impurity concentration are designed with the withstand voltage design of 3.3 kV, and the configuration thereof is a configuration in which an FLR (Field Limiting Ring) region is added at the outer peripheral side more than the terminal end well region 2 against the silicon carbide semiconductor device 100 in accordance with the present embodiment.

As shown in FIG. 6, as the dose amount in the terminal end well region 2 is made to increase, the electric field strength at the outer peripheral side of the electrode pad 5 can be relaxed, and as compared with the case shown in FIG. 5 where the value of dV/dt is 50 kV/μs, the electric field strength can be relaxed by increasing the dose amount in the terminal end well region 2 even though the value of dV/dt is increased, and it is possible to make the electric field strength less than or equal to 2.5 [MV/cm] regardless of the protruding width.

However, when the dose amount in the terminal end well region 2 is made to increase, the electric field strength within the silicon carbide semiconductor layer 1b in a static off-state is increased, and there has been a fear that the withstand voltage of the silicon carbide semiconductor device 100 is lowered. FIG. 7 shows the simulation result indicating the relationship between the dose amount [$cm^{-2}$] of the P type impurity in the terminal end well region 2 and the avalanche breakdown voltage. The simulation shown in FIG. 7 is performed under the same condition as that for the simulation shown in FIG. 6. In this connection, the avalanche breakdown voltage refers to an applied voltage at the point of time when the avalanche breakdown occurs in the silicon carbide semiconductor layer at the time of gradually making the voltage applied to the silicon carbide semiconductor device large.

As shown in FIG. 7, as the dose amount of the P type impurity in the terminal end well region 2 increases, the avalanche breakdown voltage is lowered. This is attributed to an increase in the dose amount of the P type impurity and an increase in the electric field at the end part of the terminal end well region 2 within the silicon carbide semiconductor layer 1b in a static off-state. As such, when the dose amount of the P type impurity in the terminal end well region 2 is made to excessively increase for the purpose of electric field relaxation at the time of switching, there is a fear that the element withstand voltage is lowered since the avalanche breakdown voltage of the silicon carbide semiconductor layer 1b is lowered. That is, the withstand voltage decided by the electric field in a static off-state (static withstand voltage) and the withstand voltage decided by the electric field at the time of dynamic switching (dynamic withstand voltage) are in a trade-off relationship since the static withstand voltage and the dynamic withstand voltage differ in the optimum dose amount in the terminal end well region 2.

On that account, in the present embodiment, by setting the dose amount of the P type impurity in the terminal end well region 2 to $2.0 \times 10^{13}$/$cm^2$ lying within the range of $1.0 \times 10^{13}$/$cm^2$ to $1 \times 10^{14}$/$cm^2$ (more preferably $2.0 \times 10^{13}$/$cm^2$ to $5 \times 10^{13}$/$cm^2$), the lowering in the avalanche breakdown voltage is suppressed to secure the static withstand voltage, and by setting the protruding width of the electrode pad 5 to 100 μm or less (more preferably 70 μm or less, further preferably 30 μm or less), the electric field at the time of switching can be relaxed to secure the dynamic withstand voltage, and it is possible to achieve both the static withstand voltage and the dynamic withstand voltage.

Furthermore, when the outer peripheral end of the electrode pad 5 is arranged close to the outer peripheral end of the terminal end well region 2, the electric field strength at the outer peripheral upper end of the electrode pad 5 is increased, and there is a fear that the dielectric breakdown of polyimide is caused.

FIG. 8 shows the simulation results obtained by calculating the relationship between the distance D [μm] between the outer peripheral end of the terminal end well region 2 and the outer peripheral end of the electrode pad 5 and the electric field strength [MV/cm] at the outer peripheral upper end of the electrode pad 5. In FIG. 8, the vertical axis indicates the electric field strength at the outer peripheral upper end of the electrode pad 5, the horizontal axis indicates the distance D, the filled diamond marker indicates the electric field strength obtained when the value of dV/dt is 10 kV/μs, the filled square marker indicates the electric field strength obtained when the value of dV/dt is 20 kV/μs, and the filled triangle marker indicates the electric field strength obtained when the value of dV/dt is 50 kV/μs. The simulation model shown in FIG. 8 is the same as the simulation model shown in FIG. 5, and as in the case of FIG. 5, the electric field strength at the outer peripheral upper end of the electrode pad 5 shown in FIG. 8 refers to the electric field strength at a point arranged at a distance of 10 nm from the outer peripheral upper end of the electrode pad 5 to the outer peripheral side in the planar direction. In this connection, at the time of calculating the distance D, in the case where the end faces of an outer peripheral end of the electrode pad 5 and an outer peripheral end of the terminal end well region 2 are inclined, the outer peripheral lower end of the electrode pad 5 and the outer peripheral upper end of the terminal end well region 2 are used as references.

As shown in FIG. 8, although the electric field strength at the outer peripheral upper end of the electrode pad 5 becomes a value of several MV/cm order when the distance D between the outer peripheral end of the terminal end well region 2 and the outer peripheral end of the electrode pad 5 is short, by setting the distance D to 20 μm or more, more preferably 40 μm or more, the electric field strength at the outer peripheral upper end of the electrode pad 5 can be reduced to 1.0 MV/cm or less. It is considered that, as described above with reference to FIG. 3 and FIG. 4, this is attributed to the density of equipotential lines which can be relaxed around the outer peripheral upper end of the electrode pad 5 constituting a corner part by making the outer peripheral end of the electrode pad 5 apart from the periphery of the outer peripheral end of the terminal end well region 2 where equipotential lines become dense since a depletion layer intrudes thereinto. Accordingly, it is desirable that the distance D between the outer peripheral end of the terminal end well region 2 and the outer peripheral end of the electrode pad 5 be set to 20 μm or more, more preferably 40 μm or more, this also enables the electric field at the outer peripheral upper end of the electrode pad 5 to be relaxed, and it is possible to further enhance the reliability of the silicon carbide semiconductor device 100.

Moreover, in the present embodiment, the terminal end region is provided with only a terminal end well region 2 functioning as a guard ring, but the embodiment should not be limited thereto. For example, a JTE (Junction Termination Extension) region adjacent to the outer peripheral side of the terminal end well region 2 may be provided to make the silicon carbide semiconductor device have such a configuration that the P type impurity concentration is progressively lowered toward the outer peripheral side, and the silicon carbide semiconductor device may have a configuration in which, at the outer peripheral side of the terminal end well region 2, a plurality of FLR regions separated from the terminal end well region 2 are provided. In this connection, in the case where the JTE region is provided, the terminal end well region 2 is defined as one terminal end well region 2 including the JTE region, and the distance D between the outer peripheral end of the terminal end well region 2 and the outer peripheral end of the electrode pad 5 described above is defined as the distance between the outer peripheral end of the JTE region and the outer peripheral end of the electrode pad 5. Thus, in the case where the JTE region is provided, by setting the distance between the outer peripheral end of the JTE region and the outer peripheral end of the electrode pad 5 to 20 μm or more (more preferably 40 μm or more), it is possible to relax the electric field at the outer peripheral upper end of the electrode pad 5.

In this connection, in the present embodiment, although an SiC-SBD is exemplified, a PN diode which is provided with an active region brought into ohmic contact with a surface electrode in the active region, a PiN diode and the like may be adopted. Furthermore, the silicon carbide semiconductor device may have a configuration in which regions where the Schottky electrode 4, which is called a so-called JBS (Junction Barrier Schottky diode) or an MPS (Merged PiN Schottky diode), is brought into Schottky contact with the silicon carbide semiconductor layer 1b and regions where the Schottky electrode 4 is brought into ohmic contact with the silicon carbide semiconductor layer 1b mixedly coexist.

Embodiment 2

In Embodiment 1 described above, although electric field relaxation at the time of switching is attained by reducing the protruding width of the electrode pad 5, for the purpose of attaining further electric field relaxation, a high concentration terminal end well region where the P type impurity concentration is higher may be provided within a terminal end well region. On that account, as Embodiment 2, a silicon carbide semiconductor device provided with a high concentration terminal end well region will be described below.

FIG. 9 is a sectional view showing a silicon carbide semiconductor device 200 in accordance with the present embodiment. Since the silicon carbide semiconductor device 200 is different from the silicon carbide semiconductor device 100 in accordance with Embodiment 1 in the point that a high concentration terminal end well region 8 is provided thereto, hereinafter, only the high concentration terminal end well region 8 will be described, and the description for other constituent elements will be omitted.

As shown in FIG. 9, the high concentration terminal end well region 8 is formed in the inside of the terminal end well region 2 and is a P type impurity region where the dose amount of the P type impurity is higher than that of the terminal end well region 2. Moreover, the high concentration terminal end well region 8 extends up to the inner peripheral side more than the inner peripheral end of the field insulation film 3 so as to be brought into contact with the Schottky electrode 4 and extends to the outer peripheral side more than the outer peripheral end of the electrode pad 5 so that the outer peripheral end of the Schottky electrode 4 and the outer peripheral end of the electrode pad 5 are situated above the high concentration terminal end well region 8.

Furthermore, it is preferred that the high concentration terminal end well region 8 be contained within the terminal end well region 2, that is, the outer peripheral portion of the high concentration terminal end well region 8 lie within the terminal end well region 2 so as not to allow the high concentration terminal end well region 8 and the silicon carbide semiconductor layer 1b to be brought into contact with each other. The dose amount of the P type impurity in the high concentration terminal end well region 8 is set to $1.0\times10^{14}/cm^2$ or more and $1.0\times10^{15}/cm^2$ or less and is more preferably set to $2.0\times10^{14}/cm^2$ or more. In this connection, when the injection energy is set to 100 keV to 700 keV and the dose amount $[cm^{-2}]$ in the high concentration terminal end well region 8 is converted into the impurity concentration $[cm^{-3}]$, the impurity concentration therein is determined to be $8.0\times10^{17}/cm^3$ to $2.0\times10^{20}/cm^3$.

Hereinafter, the action/effect of the silicon carbide semiconductor device 200 in accordance with the present embodiment will be described.

In the present embodiment, since it is possible to suppress the lowering in effective acceptor concentration at the time when ionization of the P type impurity is delayed at the time of switching by providing the high concentration terminal end well region 8 within the terminal end well region 2, it is possible to suppress intrusion of an equipotential line into the terminal end well region 2. As a result, since it is possible to relax the density of equipotential lines around the outer peripheral end of the electrode pad 5, it is possible to relax the electric field strength applied to the outer peripheral end of the electrode pad 5.

Moreover, when the dose amount of the P type impurity in the terminal end well region 2 is made to increase, as described above, there is a fear that the electric field within the silicon carbide semiconductor layer 1b in a static off-state is increased and the avalanche breakdown voltage is lowered, but in the present embodiment, the high concentration terminal end well region 8 where the dose amount of the P type impurity is high is partially provided within the terminal end well region 2 to suppress an increase in electric field within the silicon carbide semiconductor layer 1b. In particular, since the high concentration terminal end well region 8 is formed so as to be contained within the terminal end well region 2, it is possible to effectively suppress an increase in electric field within the silicon carbide semiconductor layer 1b.

Furthermore, in the present embodiment, since the outer peripheral end of the electrode pad 5 is situated above the high concentration terminal end well region 8, it is possible to further relax the electric field at the outer peripheral end of the electrode pad 5. FIG. 10 is a sectional view showing a silicon carbide semiconductor device 201 in accordance with a comparative example of the present embodiment, FIG. 11 is a sectional view showing the silicon carbide semiconductor device 200 in accordance with the present embodiment, and in both figures, curved lines shown by a broken line schematically show equipotential lines at the time when the back electrode 7 is applied with a high voltage at the time of switching.

With regard to the silicon carbide semiconductor device 201 in accordance with a comparative example shown in FIG. 10, the outer peripheral end of the high concentration terminal end well region 8 exists at the inner side more than the outer peripheral end of the electrode pad 5. As such, at the time of switching as shown in FIG. 10, an equipotential line intrudes up to the periphery of the outer peripheral end of the high concentration terminal end well region 8, and the electric field relaxation effect at the outer peripheral end of the electrode pad 5 has been limited since an equipotential line wraps around the outer peripheral end of the electrode pad 5 extending to the outer peripheral side more than the high concentration terminal end well region 8.

On that account, in the silicon carbide semiconductor device 200 in accordance with the present embodiment, by making the outer peripheral end of the high concentration terminal end well region 8 extend beyond the outer peripheral end of the electrode pad 5 so that the outer peripheral end of the electrode pad 5 is situated above the high concentration terminal end well region 8, since the intrusion of an equipotential line at the time of switching is suppressed by the high concentration terminal end well region 8 which exists at the outer peripheral side more than the electrode pad 5 as shown in FIG. 11, it is possible to relax the density and curvature of equipotential lines around the outer peripheral end of the electrode pad 5 and it is possible to further enhance the electric field relaxation effect.

Like the present embodiment, by providing the high concentration terminal end well region 8 so that the outer peripheral end of the electrode pad 5 is situated above the high concentration terminal end well region 8, it is possible to particularly reduce the electric field strength applied to the outer peripheral lower end among outer peripheral ends of the electrode pad 5. In this case, since there are cases where the electric field strength applied to the outer peripheral upper end of the electrode pad 5 becomes higher than that applied to the outer peripheral lower end thereof, in the case where it is necessary to further reduce the electric field strength at the outer peripheral upper end of the electrode pad 5, like a silicon carbide semiconductor device 202 shown in FIG. 12, a tapered part 5a may be provided at the outer peripheral end of the electrode pad 5. With this setup, it is possible to relax the curvature of an equipotential line around the outer peripheral upper end of the electrode pad 5.

Moreover, also in the present embodiment, by setting the protruding width of the electrode pad 5 to 100 μm or less (more preferably 70 μm or less, further preferably 30 μm or less), it is possible to relax the electric field strength at the outer peripheral end of the electrode pad 5 at the time of dynamic switching while suppressing an increase in electric field in a static off-state. Furthermore, by setting the distance between the outer peripheral end of the electrode pad 5 and the outer peripheral end of the terminal end well region 2 to 20 μm or more (more preferably 40 μm or more), it is possible to reduce the electric field strength at the outer peripheral upper end of the electrode pad 5 at the time of switching and to further enhance the reliability of the silicon carbide semiconductor device.

In this connection, the tapered shape specified by the tapered part 5a refers to a shape in which the upper end position of the outer peripheral end of the electrode pad 5 is made to retreat to the inner peripheral side against the lower end position thereof. It is desirable that the retreating amount of the outer peripheral upper end be set to 40% to 100% relative to the thickness of the electrode pad 5. Moreover, in FIG. 12, although the tapered part 5a is illustrated as if the end face thereof is flat, since this is aimed at relaxing the electric field at the outer peripheral upper end which is one of concentrated points of electric fields, it is not necessary for the tapered part 5a to have an end face with a flat shape in the strict sense, and the shape needs only to be such a shape that the outer peripheral upper end of the electrode pad 5 is made to retreat to the inner peripheral side against the outer peripheral lower end thereof.

Moreover, like a silicon carbide semiconductor device 203 described in FIG. 13, with regard to the shape of the high concentration terminal end well region 8, the high concentration terminal end well region 8 may be composed of a plurality of portions separated from one another. Furthermore, like a silicon carbide semiconductor device 204 shown in FIG. 14, the terminal end well region 2 may be provided at a position deeper than the surface of the silicon carbide semiconductor layer 1b. That is, a portion of the silicon carbide semiconductor layer 1b may be interposed between the terminal end well region 2 and the Schottky electrode 4 and between the terminal end well region 2 and the field insulation film 3. Moreover, as in the case thereof, also with regard to the high concentration terminal end well region 8, although it is not illustrated, the region may be provided at a position deeper than the surface of the silicon carbide semiconductor layer 1b.

Embodiment 3

In Embodiments 1 and 2 described above, although examples of the SiC-SBD which is a diode element are described, the present invention may be applied to a switching element. On that account, as Embodiment 3, the case where the present invention is applied to an MOSFET (Metal Oxide Semiconductor Field Effect Transistor) which is a switching element will be described.

FIG. 15 and FIG. 16 are sectional views showing a silicon carbide semiconductor device 300 in accordance with the present embodiment. FIG. 15 is a sectional view of a region where a source electrode 15 described below extends up to the terminal end region side, and FIG. 16 is a sectional view of a region where a gate electrode 13 described below extends up to the terminal end region side to connect to a gate pad 16. That is, FIG. 15 is a sectional view of a region where the source electrode 15 extends to the outermost peripheral side, and FIG. 16 is a sectional view of a region where the gate electrode 13 extends to the outermost peripheral side.

In FIG. 15 and FIG. 16, the silicon carbide semiconductor device 300 is an MOSFET provided with a silicon carbide substrate 1, an interlayer insulation film 12, a gate electrode 13, a gate insulation film 14, a source electrode 15, a field insulation film 3, a surface protective film 6 and a back electrode 7 (drain electrode). As in the case of each of Embodiments 1 and 2, the silicon carbide substrate 1 is composed of a substrate layer 1a and a silicon carbide semiconductor layer 1b. The back electrode 7 which is a drain electrode is formed at the back surface side of the substrate layer 1a. In a so-called active region (the left side in each of FIG. 15 and FIG. 16) within the silicon carbide semiconductor layer 1b, an active well region 9, a high concentration active well region and a source region 11 are formed, and in the terminal end region, a terminal end well region 2 is formed.

The active well region 9 is a P type impurity region formed at a part of the upper layer of the silicon carbide semiconductor layer 1b. The high concentration active well region 10 and the source region 11 are formed at a part of the upper layer of the active well region 9, the high concentration active well region 10 is a P type impurity region where the P type impurity amount therein is higher than that in the active well region 9, and the source region 11 is an N type impurity region. The gate electrode 13 is formed so as to span across the active well region 9 and the source region 11 with the gate insulation film 14 interposed between the gate electrode 13 and these regions, and the interlayer insulation film 12 is formed so as to cover the gate electrode 13. The source electrode 15 extends onto the interlayer insulation film 12 and connects to the source region 11 and the high concentration active well region 10 through the contact hole.

In FIG. 15, on the silicon carbide semiconductor layer 1b at the terminal end region side, the field insulation film 3 is formed, and the outer peripheral end of the source electrode 15 extends onto the field insulation film 3. And then, in FIG. 15, the outer peripheral end of the source electrode 15 is situated above the terminal end well region 2, and the distance (hereinafter, referred to as "the protruding width of the source electrode 15") in the horizontal direction from the inner peripheral end of the field insulation film 3 to the outer peripheral end of the source electrode 15 is set to 100 μm or less, more preferably 70 μm or less and further preferably 30 μm or less. Furthermore, it is preferred that the distance between the outer peripheral end of the source electrode 15 and the outer peripheral end of the terminal end well region 2 be set to 20 μm or more, and it is more preferred that the distance therebetween be set to 40 μm or more. On the source electrode 15 and the field insulation film 3, the surface protective film 6 is formed so as to cover the outer peripheral end of the source electrode 15.

Moreover, in FIG. 16, on the silicon carbide semiconductor layer 1b at the terminal end region side, the field insulation film 3 is formed, and the outer peripheral end of the gate electrode 13 extends onto the field insulation film 3. Moreover, although the interlayer insulation film 12 is formed on the gate electrode 13 above the terminal end region, a contact hole is formed in a part thereof, and the gate pad 16 is connected to the gate electrode 13 through the contact hole in the interlayer insulation film 12. And then, in FIG. 16, the outer peripheral end of the gate electrode 13 is situated above the terminal end well region 2, and the distance (hereinafter, referred to as "the protruding width of the gate electrode 13") in the horizontal direction from the inner peripheral end of the field insulation film 3 to the outer peripheral end of the gate electrode 13 is set to 100 μm or less, more preferably 70 μm or less and further preferably 30 μm or less. On the gate electrode 13 and the field insulation film 3, the surface protective film 6 is formed so as to cover the outer peripheral end of the gate electrode 13.

Like the present embodiment, also in a silicon carbide semiconductor device 300 which is a switching element, the voltage can be held to enhance the withstand voltage because a depletion layer is made to extend from the terminal end well region 2 formed in the terminal end region when the back electrode 7 in an off-state is applied with a high voltage. However, at the time of switching, an equipotential line intrudes into the terminal end well region 2 since the extension of the depletion layer from the terminal end well region 2 is delayed, and there is a fear that electric field concentration occurs at the outer peripheral end of the source electrode 15 and the outer peripheral end of the gate electrode 13 which are formed above the field insulation film 13.

On that account, in the present embodiment, as in the case of each of Embodiments 1 and 2, by setting each of the protruding width of the source electrode 15 and the protruding width of the gate electrode 13 to 100 μm or less, more preferably 70 μm or less and further preferably 30 μm or less, it is possible to relax the electric field around the outer peripheral end of each of the source electrode 15 and the gate electrode 13. Moreover, by setting each of the distance between the outer peripheral end of the source electrode 15 and the outer peripheral end of the terminal end well region 2 and the distance between the outer peripheral end of the gate electrode 13 and the outer peripheral end of the terminal end well region 2 to 20 μm or more (more preferably 40 μm or more), it is possible to relax each of the electric field at the outer peripheral end of the source electrode 15 and the electric field at the outer peripheral end of the gate electrode 13.

In this connection, also with regard to the gate pad 16 shown in FIG. 16, as in the case of each of the source electrode 15 and the gate electrode 13, by setting the distance from the inner peripheral end of the field insulation film 3 to the outer peripheral end of the gate pad 16 to 100 μm or less, more preferably 70 μm or less and further preferably 30 μm or less, or by setting the distance between the outer peripheral end of the gate pad 16 and the outer peripheral end of the terminal end well region 2 to 20 μm or more (more preferably 40 μm or more), it is possible to relax the density and curvature of equipotential lines around the outer peripheral end of the gate pad 16 at the time of switching and to relax the electric field concentration.

Moreover, although it is not illustrated, between the source electrode 15 and the interlayer insulation film 12 and between the source electrode 15 and the field insulation film 3, a barrier metal composed of Ti and the like may be interposed. For example, the barrier metal may be a metal thin film containing Ti such as Ti, TiN and TiSi, and the barrier metal may have a structure in which a plurality of these metals are layered. Since the barrier metal is a thin film of several tens of nm and there is a fear that an etching residue is formed at an outer peripheral end, as in the case of the Schottky electrode 4 in Embodiment 1, by covering the outer peripheral end of the barrier metal with the source electrode 15, the electric field concentration at the outer peripheral end of the barrier metal can be suppressed. In this connection, as in the case thereof, by interposing a barrier metal also between the gate pad 16 and the interlayer insulation film 12 and covering the outer peripheral end of the barrier metal with the gate pad 16, the electric field concentration at the outer peripheral end of the barrier metal can be suppressed. In this case, the barrier metal constitutes the first surface electrode, and the source electrode 15 or the gate pad 16 constitutes the second surface electrode.

In this connection, also in the present embodiment, a high concentration terminal end well region 8 may be formed within the terminal end well region 2 to attain further electric field relaxation. In the case of forming the high concentration terminal end well region 8, as shown in FIG. 17, by providing the outer peripheral end of the source electrode 15 above the high concentration terminal end well region 8, it is possible to further relax the electric field at the outer peripheral end of the source electrode 15. In this connection, although it is not illustrated, also with regard to each of the gate electrode 13 and the gate pad 16, by providing the outer peripheral end thereof above the high concentration terminal end well region 8, the same effect can be obtained.

Moreover, like a silicon carbide semiconductor device 301 shown in FIG. 17, by forming a high concentration terminal end well region 8 within the terminal end well region 2 and making the high concentration terminal end well region 8 extend to the cell region side, the high concentration terminal end well region 8 may be brought into contact with the source electrode 15 instead of the outermost peripheral high concentration active well region 10. Furthermore, in the silicon carbide semiconductor device 301 shown in FIG. 17, in order to relax the electric field at the upper end of the outer peripheral end of the source electrode 15, a tapered part is provided at the outer peripheral end of the source electrode 15. In this connection, although it is not illustrated, a tapered part may also be provided at the outer peripheral end of each of the gate electrode 13 and the gate pad 16.

Moreover, like a silicon carbide semiconductor device 302 shown in FIG. 18, an outermost peripheral high concentration active well region 10 may be made to extend up to the inside of the terminal end well region 2 to be used as a high concentration terminal end well region, and a high concentration active well region 10 composed of a plurality of portions separated from one another may be provided at the outer peripheral side.

Moreover, in Embodiment 3 of the present invention, a part which is different from that in Embodiment 1 of the present invention has been described, and the description for a part which is the same as or corresponds to that in Embodiment 1 thereof has been omitted.

In this connection, with regard to the present invention, in the scope of the invention, it is possible to freely combine respective embodiments and to properly modify or omit respective embodiments.

REFERENCE SIGNS LIST

1: silicon carbide substrate
1a: substrate layer
1b: silicon carbide semiconductor layer
2: terminal end well region
3: field insulation film
4: Schottky electrode (first surface electrode)
5: electrode pad (second surface electrode)
5a: tapered part
6: surface protective film
7: back electrode
8: high concentration terminal end well region
9: active well region
10: high concentration active well region
11: source region
12: interlayer insulation film
13: gate electrode
14: gate insulation film
15: source electrode
16: gate pad
100, 200, 300: silicon carbide semiconductor device

The invention claimed is:

1. A silicon carbide semiconductor device, comprising:
a first conductivity-type silicon carbide substrate having an inner peripheral side toward an active area region and an outer peripheral side toward a termination area region;
a field insulation film which is formed on the surface of said silicon carbide substrate;
a first surface electrode which is formed farther towards the inner peripheral side than said field insulation film on the surface of said silicon carbide substrate and extends above at least a portion of said field insulation film;
a second surface electrode which covers said first surface electrode and extends beyond an outer peripheral end of said first surface electrode onto said field insulation film, and an outer peripheral end of the second surface electrode extends beyond an inner peripheral end of the field insulation film by a protruding width;
a second conductivity-type terminal end well region which is brought into contact with at least a part of said first surface electrode at an upper part within said silicon carbide substrate and extends to the outer peripheral side farther than the outer peripheral end of said second surface electrode within said silicon carbide substrate;
a surface protective film which is formed on said field insulation film and on said second surface electrode so as to cover the outer peripheral end of said second surface electrode and is composed of an insulation material; and
a back electrode which is formed on the back surface of said silicon carbide substrate,
wherein the protruding width is selected so that an electric field strength applied to the outer peripheral lower end of said second surface electrode is equal to or less than the smallest dielectric breakdown strength among the dielectric breakdown strength of said field insulation film and the dielectric breakdown strength of said surface protective film at the time of switching when the value of dV/dt is greater than or equal to 10 kV/μs.

2. The silicon carbide semiconductor device according to claim 1, wherein the distance between the outer peripheral end of said second surface electrode and the outer peripheral end of said terminal end well region is greater than or equal to 20 μm.

3. The silicon carbide semiconductor device according to claim 1, further comprising, within said terminal end well region, a second conductivity-type high concentration terminal end well region of which the dose amount of a second conductivity-type impurity is higher than that of said terminal end well region.

4. The silicon carbide semiconductor device according to claim 3, wherein the outer peripheral end of said second surface electrode exists above said high concentration terminal end well region.

5. The silicon carbide semiconductor device according to claim 1, wherein the dose amount of a second conductivity-type impurity in said terminal end well region is $2.0 \times 10^{13}/\text{cm}^2$ to $5.0 \times 10^{13}/\text{cm}^2$.

6. The silicon carbide semiconductor device according to claim 1, wherein said second surface electrode contains at least one kind of metal among Al, Cu and Mo.

7. The silicon carbide semiconductor device according to claim 1, wherein said first surface electrode contains at least one kind of metal among Ti, Mo, Ni, Au and W.

8. The silicon carbide semiconductor device according to claim 1, wherein a tapered part is provided at the outer peripheral end part of said second surface electrode.

9. The silicon carbide semiconductor device according to claim 1, further comprising a second conductivity-type FLR region which is formed at an upper part within said silicon carbide substrate and at the outer peripheral side more than said terminal end well region.

10. A silicon carbide semiconductor device, comprising:
a first conductivity-type silicon carbide substrate;
a field insulation film which is formed on the surface of said silicon carbide substrate and has a thickness of 0.5 μm to 3.0 μm;
a first surface electrode which is formed at the inner peripheral side more than said field insulation film on the surface of said silicon carbide substrate and is made to run on said field insulation film;

a second surface electrode which covers said first surface electrode and extends beyond the outer peripheral end of said first surface electrode onto said field insulation film;

a second conductivity-type terminal end well region which is brought into contact with at least a part of said first surface electrode at an upper part within said silicon carbide substrate and extends to the outer peripheral side more than the outer peripheral end of said second surface electrode in said silicon carbide substrate;

a surface protective film which is formed on said field insulation film and on said second surface electrode so as to cover the outer peripheral end of said second surface electrode and is composed of an insulation material; and a back electrode which is formed on the back surface of said silicon carbide substrate, wherein said silicon carbide substrate has a first conductivity-type silicon carbide semiconductor layer of a first conductivity-type impurity concentration of $1.0 \times 10^{14}/\text{cm}^3$ to $1.0 \times 10^{16}/\text{cm}^3$, said terminal end well region is formed within said silicon carbide semiconductor layer, the dose amount of a second conductivity-type impurity within said terminal end well region is $1.0 \times 10^{13}/\text{cm}^2$ to $1.0 \times 10^{14}/\text{cm}^2$, and the distance between the outer peripheral end of said second surface electrode and the inner peripheral end of said field insulation film is less than or equal to 100 μm and an electric field strength applied to the outer peripheral end of the second surface electrode is equal to or less than the smallest dielectric breakdown strength among the dielectric breakdown strength of the field insulation film and the dielectric breakdown strength of the surface protective film at the time of switching when the value of dV/dt is greater than or equal to 10 kV/μs.

11. The silicon carbide semiconductor device according to claim 10, wherein the distance between the outer peripheral end of said second surface electrode and the outer peripheral end of said terminal end well region is greater than or equal to 20 μm.

12. The silicon carbide semiconductor device according to claim 10, further comprising, within said terminal end well region, a second conductivity-type high concentration terminal end well region of which the dose amount of a second conductivity-type impurity is higher than that of said terminal end well region.

13. The silicon carbide semiconductor device according to claim 12, wherein the outer peripheral end of said second surface electrode exists above said high concentration terminal end well region.

14. The silicon carbide semiconductor device according to claim 10, wherein said second surface electrode contains at least one kind of metal among Al, Cu and Mo.

15. The silicon carbide semiconductor device according to claim 10, wherein said first surface electrode contains at least one kind of metal among Ti, Mo, Ni, Au and W.

16. The silicon carbide semiconductor device according to claim 10, wherein a tapered part is provided at the outer peripheral end part of said second surface electrode.

17. The silicon carbide semiconductor device according to claim 10, further comprising a second conductivity-type FLR region which is formed at an upper part within said silicon carbide substrate and at the outer peripheral side more than said terminal end well region.

* * * * *